(12) United States Patent
Lin et al.

(10) Patent No.: US 12,362,246 B2
(45) Date of Patent: Jul. 15, 2025

(54) INTERPOSER INCLUDING STEPPED SURFACES AND METHODS OF FORMING THE SAME

(71) Applicant: Taiwan Semiconductor Manufacturing Company Limited, Hsinchu (TW)

(72) Inventors: Yu-Sheng Lin, Zhubei (TW); Hsin-Hsien Lee, Taoyuan County (TW); Jyun-Lin Wu, Hsinchu (TW); Yao-Chun Chuang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 482 days.

(21) Appl. No.: 17/871,375

(22) Filed: Jul. 22, 2022

(65) Prior Publication Data
US 2024/0030076 A1    Jan. 25, 2024

(51) Int. Cl.
| | |
|---|---|
| *H01L 23/13* | (2006.01) |
| *H01L 21/48* | (2006.01) |
| *H01L 21/56* | (2006.01) |
| *H01L 23/31* | (2006.01) |
| *H01L 23/498* | (2006.01) |

(52) U.S. Cl.
CPC .......... *H01L 23/13* (2013.01); *H01L 21/4853* (2013.01); *H01L 21/486* (2013.01); *H01L 21/563* (2013.01); *H01L 23/3185* (2013.01); *H01L 23/49827* (2013.01); *H01L 23/49838* (2013.01)

(58) Field of Classification Search
CPC ... H01L 23/13; H01L 23/49838–49844; H01L 23/528–5283; H01L 23/5386
See application file for complete search history.

(56) References Cited

U.S. PATENT DOCUMENTS

| | | | |
|---|---|---|---|
| 2004/0232566 A1* | 11/2004 | Mita | H01L 24/97 |
| | | | 257/E23.125 |
| 2010/0122838 A1* | 5/2010 | Asami | H01L 23/49822 |
| | | | 174/255 |
| 2021/0305145 A1* | 9/2021 | Huang | H01L 23/49861 |

\* cited by examiner

*Primary Examiner* — Evan G Clinton
(74) *Attorney, Agent, or Firm* — The Marbury Law Group, PLLC

(57) ABSTRACT

A semiconductor structure includes an interposer having a first planar surface, a set of non-horizontal surfaces having a top periphery that are adjoined to a periphery of the first planar surface, and a frame-shaped surface adjoined to a bottom periphery of the set of non-horizontal surfaces, sidewalls adjoined to the frame-shaped surface, and a second planar surface adjoined to the sidewalls; at least one semiconductor die attached to the interposer through a respective array of solder material portions; and an underfill material portion located between the interposer and the at least one semiconductor die and contacting a portion of the first planar surface.

20 Claims, 29 Drawing Sheets

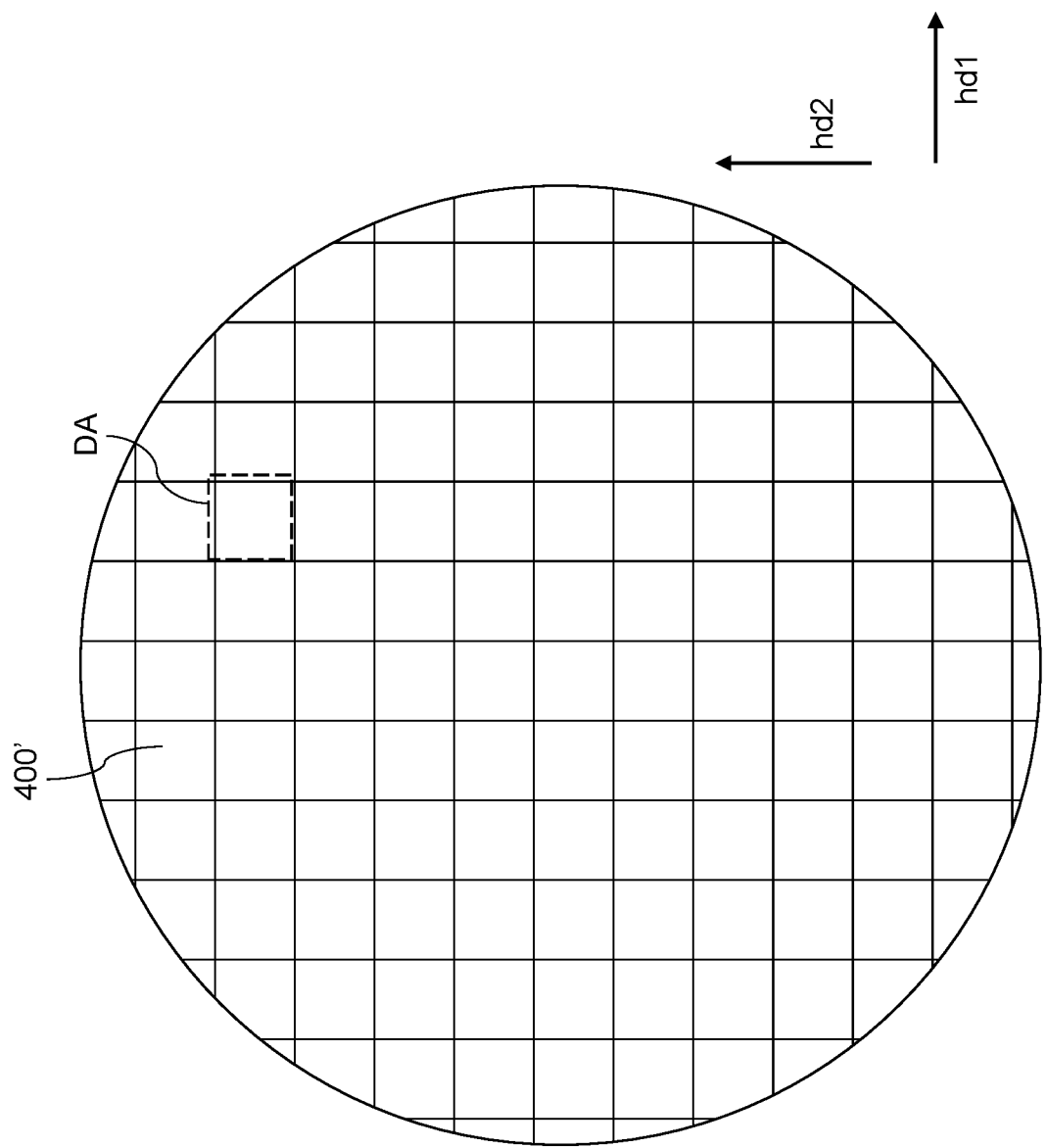

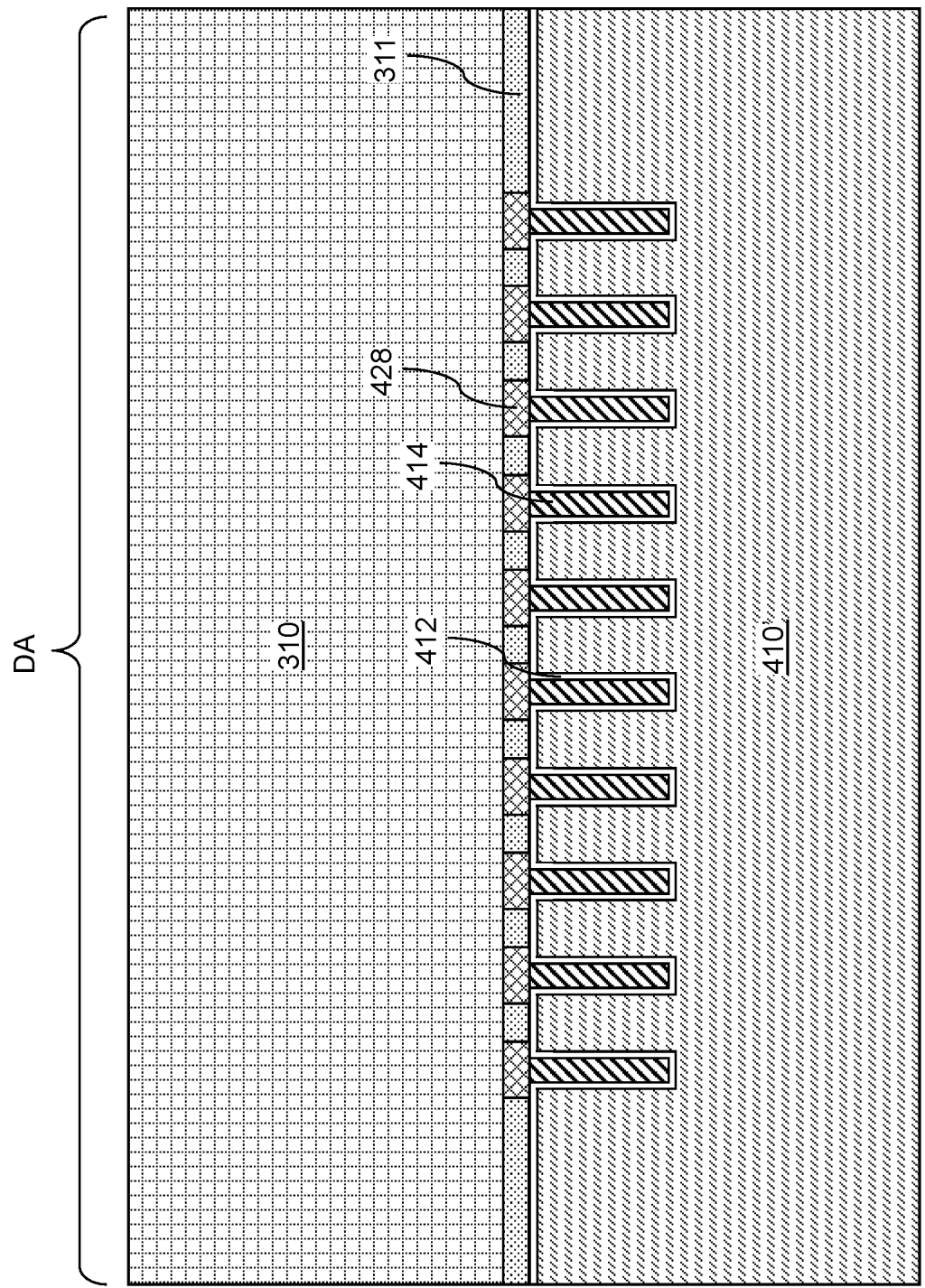

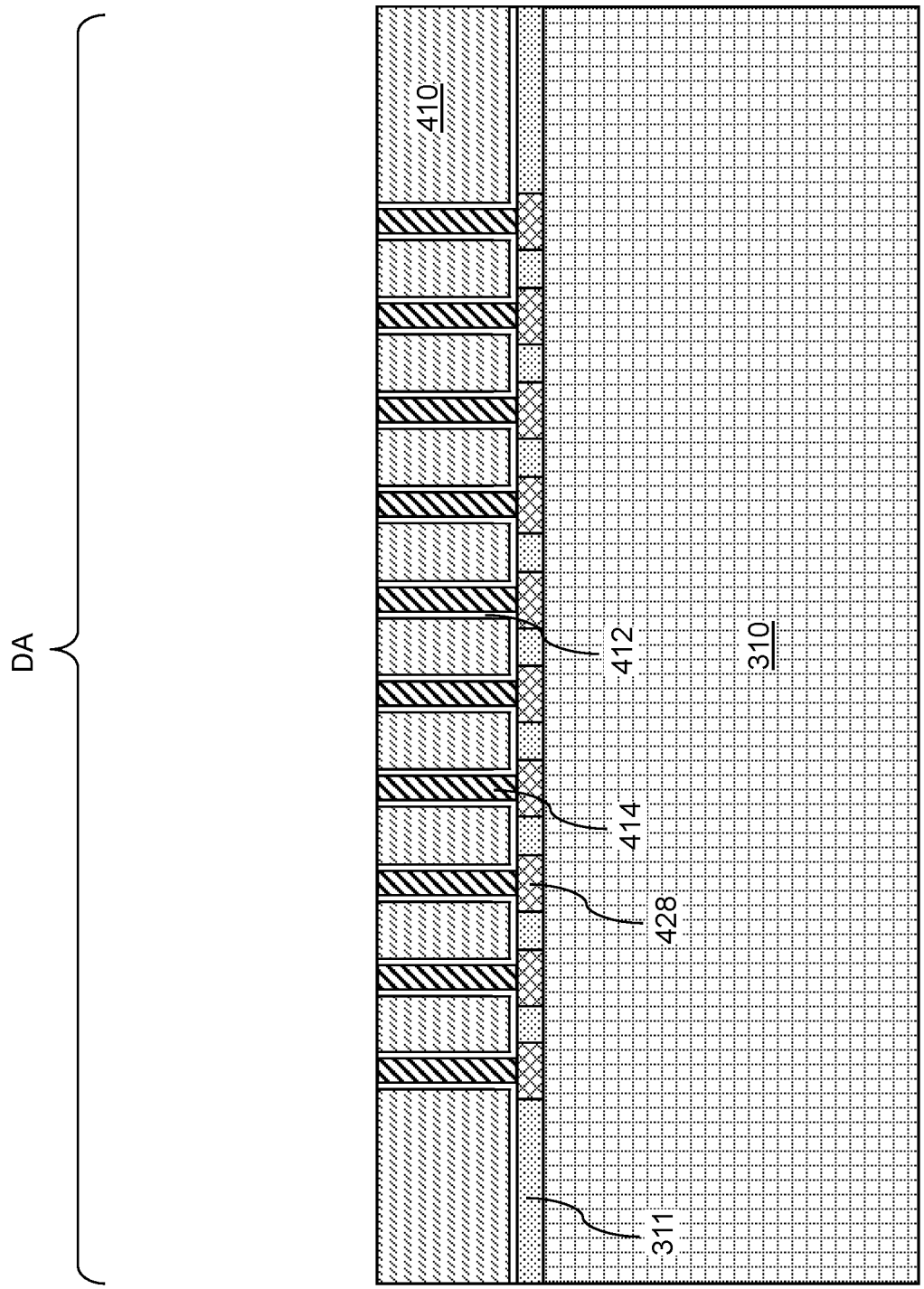

INTERPOSER INCLUDING STEPPED SURFACES AND METHODS OF FORMING THE SAME

BACKGROUND

An underfill material between an interposer and a semiconductor die is frequently subjected to mechanical stress. Failure to properly absorb the mechanical stress may result in cracks in the semiconductor die or in the interposer, and may result in a package failure. For example, cracks formed in an underfill material may induce additional cracks in a semiconductor die, solder material portions, interposers, and/or various dielectric layers within a semiconductor die or within a packaging substrate. In other instances, the various layers in the semiconductor package may delaminate. Thus, suppression of the formation of cracks or delamination in the underfill material is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a top-down view of a semiconductor substrate for forming a two-dimensional array of semiconductor interposers according to an embodiment of the present disclosure.

FIGS. 2A-2E are sequential vertical cross-sectional views of a die area within the semiconductor substrate during formation of through-substrate via structures and substrate-side bonding structures, application of a first adhesive layer, and attachment of a first carrier wafer according to an embodiment of the present disclosure.

FIGS. 3A-3D are sequential vertical cross-sectional views of a die area during formation of dielectric material layers, metal interconnect structures, and on-interposer bump structures according to an embodiment of the present disclosure.

DETAILED DESCRIPTION

Figure 2A:
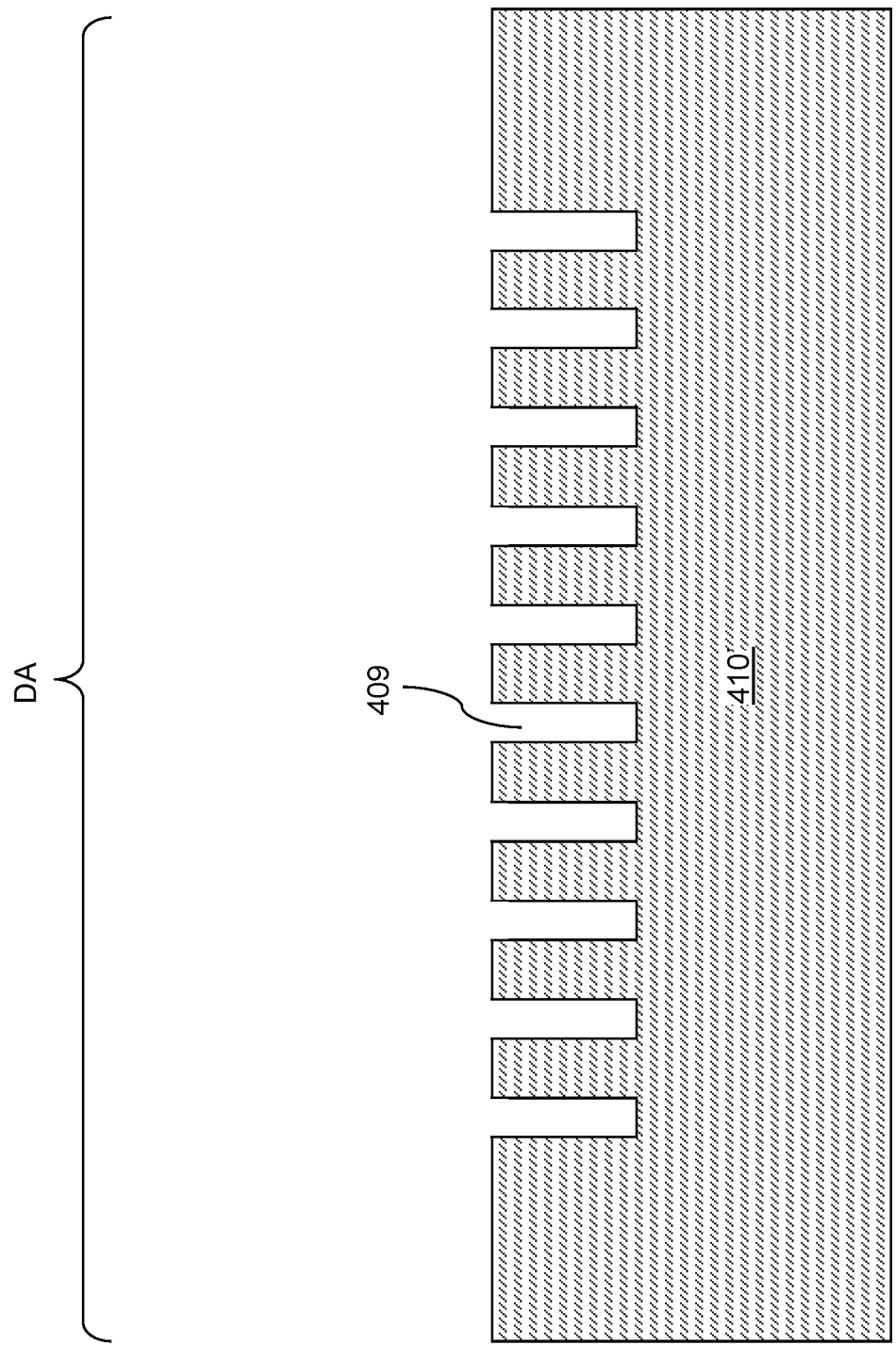

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to a chip package structure containing an interposer having a stepped surface for contacting a die frame, and methods for forming the same.

An underfill material portion at a package corner may easily delaminate or crack during manufacturing or during operation due to a mismatch between coefficients of thermal expansion between a semiconductor material and an underfill material. For example, silicon has a coefficient of thermal expansion of about $2.6 \times 10^{-6}$ per degree Celsius, and typical underfill materials have a coefficient of thermal expansion in a range from $8.0 \times 10^{-5}$ per degree Celsius to $1.0 \times 10^{-4}$ per degree Celsius. Delamination or cracking of un underfill material portion may become more serious as the package size increases. Thinning the interposer increases the warpage of the package substrate, and thus, does not adequately address the issue of cracking and/or delamination of an underfill material portion.

According to an aspect of the present disclosure, an interposer may be formed with a stepped surface, which includes a frame-shaped horizontally-extending surface that laterally encloses all semiconductor dies in a chip package such as a fan-out package. In this embodiment, a molding compound die frame may be modified to conform to the shape of the stepped surface of the interposer. This configuration reduces the contact area between the interposer and the underfill material portion, and uses the molding compound die frame to reduce the mechanical stress and to reduce delamination and/or cracking of the underfill material portion during thermal cycling of the chip package. Thus, the reliability of the chip package may be enhanced without increasing the warpage of the chip package. The various aspects of the present disclosure are now described in detail with reference to accompanying drawings.

Referring to FIG. 1, a semiconductor substrate for forming a two-dimensional array of semiconductor interposers is illustrated. The semiconductor substrate may be any commercially available semiconductor substrate such as a single crystalline silicon wafer having a diameter in a range from 100 mm to 450 mm. In one embodiment, the semiconductor substrate may include a two-dimensional periodic array of in-process semiconductor interposers 400'. As used herein, an "in-process" element refers to an element that is formed during a manufacturing process and is subsequently modified to provide a final structure. Each in-process semiconductor interposer 400' may be formed within a respective area. Each of the in-process semiconductor interposer 400' may be formed within a respective rectangular area, which is herein referred to as a die area DA. The size of each die area DA is the same as the area of a chip package (such as a fan-out package) to be subsequently formed. In an illustrative example, each die area DA may have a rectangular shape. Each side of the rectangular shape may have a length in a range from 0.5 cm to 10 cm, such as from 1 cm to 5 cm, although lesser and greater dimensions may also be used. In one embodiment, the two-dimensional array of in-process semiconductor interposers 400' may be arranged as a periodic two-dimensional array having a first pitch along a first horizontal direction hd1 and having a second pitch along a second horizontal direction hd2, which may be perpendicular to the first horizontal direction hd1.

Referring to FIGS. 2A-2E, sequential vertical cross-sectional views of a die area DA within the semiconductor substrate of FIG. 1 during formation of through-substrate via structures 414 and interposer bonding pads 428, application of a first adhesive layer 311, and attachment of a first carrier wafer 310 according to an embodiment of the present disclosure.

Referring to FIG. 2A, a photoresist layer (not shown) may be applied over a horizontal surface of a semiconductor substrate 410'. In one embodiment, the semiconductor substrate 410' may be any commercially available semiconductor substrate known in the art. For example, the semiconductor substrate 410' may be a single crystalline silicon wafer. The photoresist layer may be lithographically patterned to form a pattern of an array of discrete openings within each die area DA. For example, each array of discrete openings may be a two-dimensional periodic array of openings having a same shape. The shape of each opening may be, for example, a circle, an oval, a rectangle, a rounded rectangle, or any other two-dimensional curvilinear shape having a closed periphery. An anisotropic etch process may be performed to etch portions of the semiconductor substrate 410' that are not masked by the photoresist layer. Via cavities 409 may be formed in an upper portion of the semiconductor substrate 410' in areas that are not masked by the photoresist layer. The depth of the via cavities 409 may be in a range from 5 microns to 20 microns, although lesser and greater depths may also be used. The lateral dimension of each via cavity 409, such as a diameter of a horizontal cross-sectional shape of each via cavity 409 in embodiments in which the via cavities 409 have a circular horizontal cross-sectional shape, may be in a range from 1 micron to 10 microns, although lesser and greater lateral dimensions may also be used. The photoresist layer may be subsequently removed, for example, by ashing.

Figure 2B:
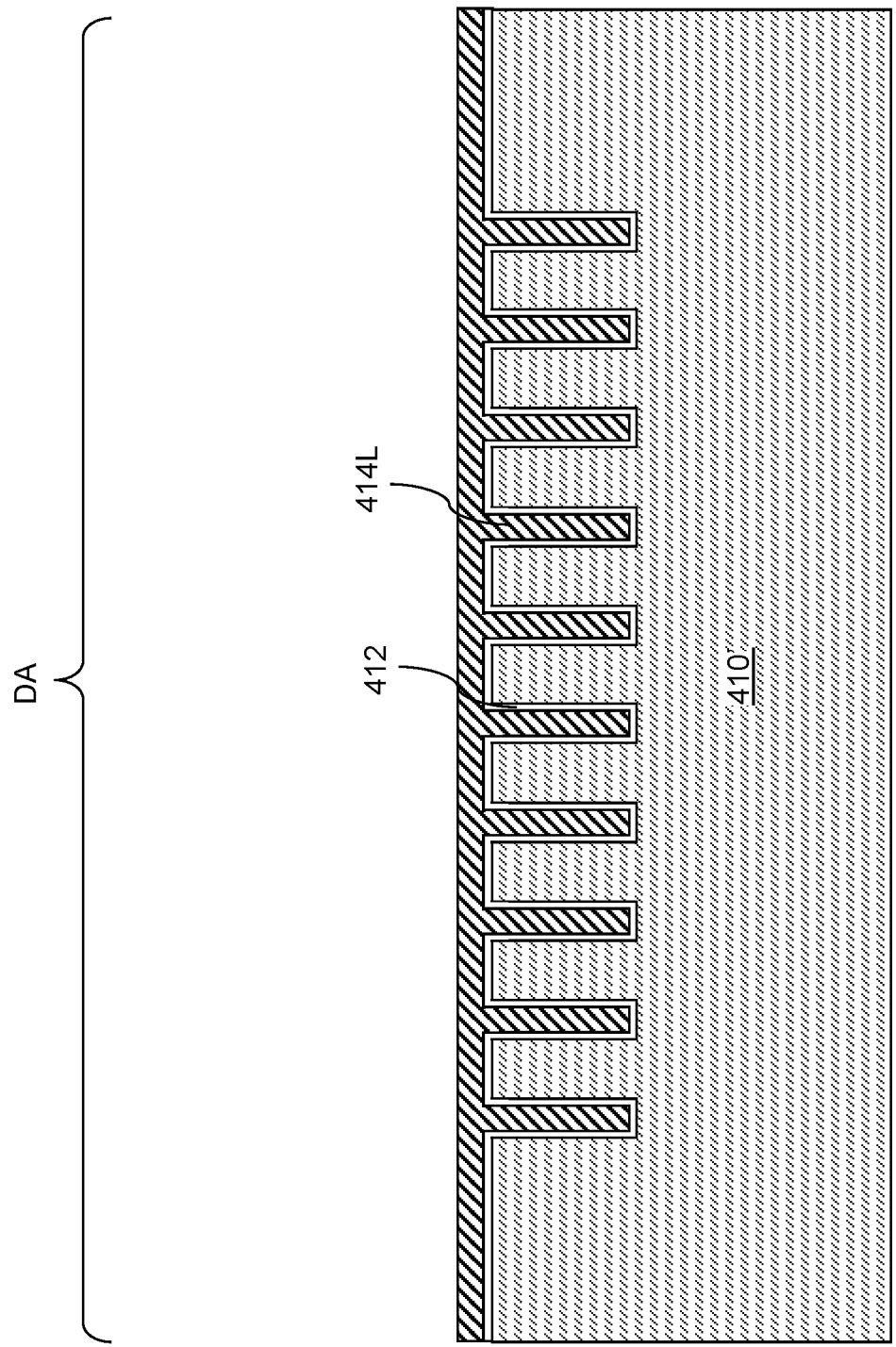

Referring to FIG. 2B, a dielectric liner 412 including at least one dielectric material may be conformally deposited. For example, the dielectric liner 412 may comprise, and/or may consist essentially of, at least one dielectric material such as silicon oxide, silicon nitride, silicon carbide, silicon carbide nitride, and/or a dielectric metal oxide (e.g., aluminum oxide, tantalum oxide, titanium oxide, etc.). The dielectric liner 412 may be deposited by a conformal deposition process such as a chemical vapor deposition process. The thickness of the dielectric liner 412 may be in a range from 50 nm to 300 nm, although lesser and greater thicknesses may also be used.

At least one conductive material, such as at least one metallic material, may be deposited in remaining volumes of the via cavities and over the dielectric liner 412 to form a conductive material layer 414L. In one embodiment, the at least one conductive material may comprise copper. In this embodiment, the conductive material layer 414L may be formed by performing a copper seed layer deposition process that uses a physical vapor deposition process or an electroless copper plating process, and by performing an electroplating process that electroplates copper on the copper seed layer. Alternatively, the conductive material layer 414L may comprise a metallic barrier liner including a metallic nitride material (such as TiN, TaN, or WN) and a metallic fill material (such as W, Ti, Ta, Mo, Co, Ru, etc.). In this embodiment, the conductive material layer 414L may be formed using at least one physical vapor deposition process and/or at least one chemical vapor deposition process. In one embodiment, the at least one conductive material may fill remaining volumes of the via cavities.

Figure 2C:
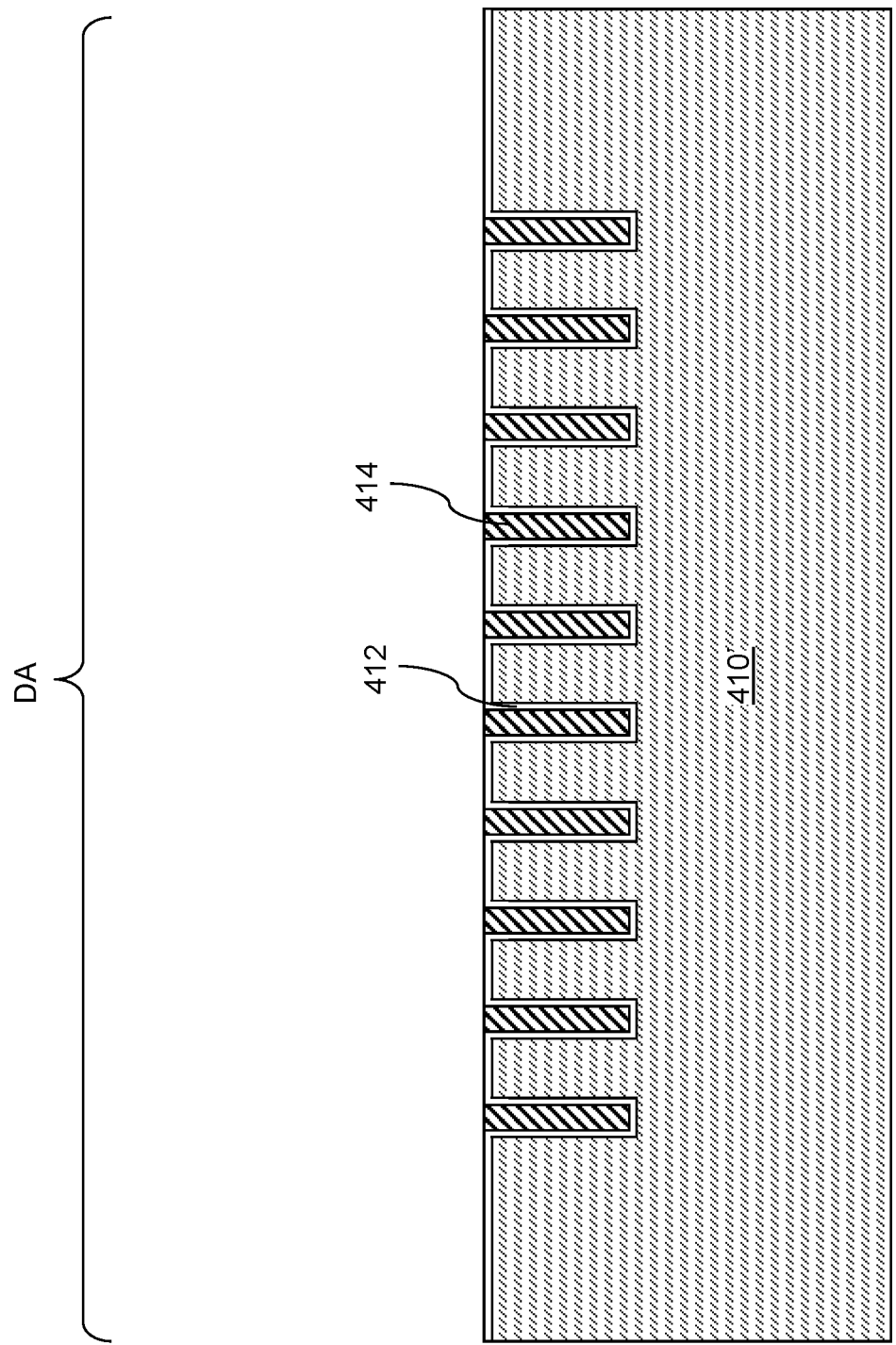

Referring to FIG. 2C, a planarization process may be performed to remove portions of the at least one conductive material from above the horizontal plane including a horizontal top surface of the conductive material layer 414L. For example, a recess etch process or a chemical mechanical planarization process may be used to remove portions of the at least one conductive material from above the horizontal plane including a horizontal top surface of the conductive material layer 414L. Each remaining portion of the at least one conductive material constitutes a through-substrate via structure 414.

Figure 2D:
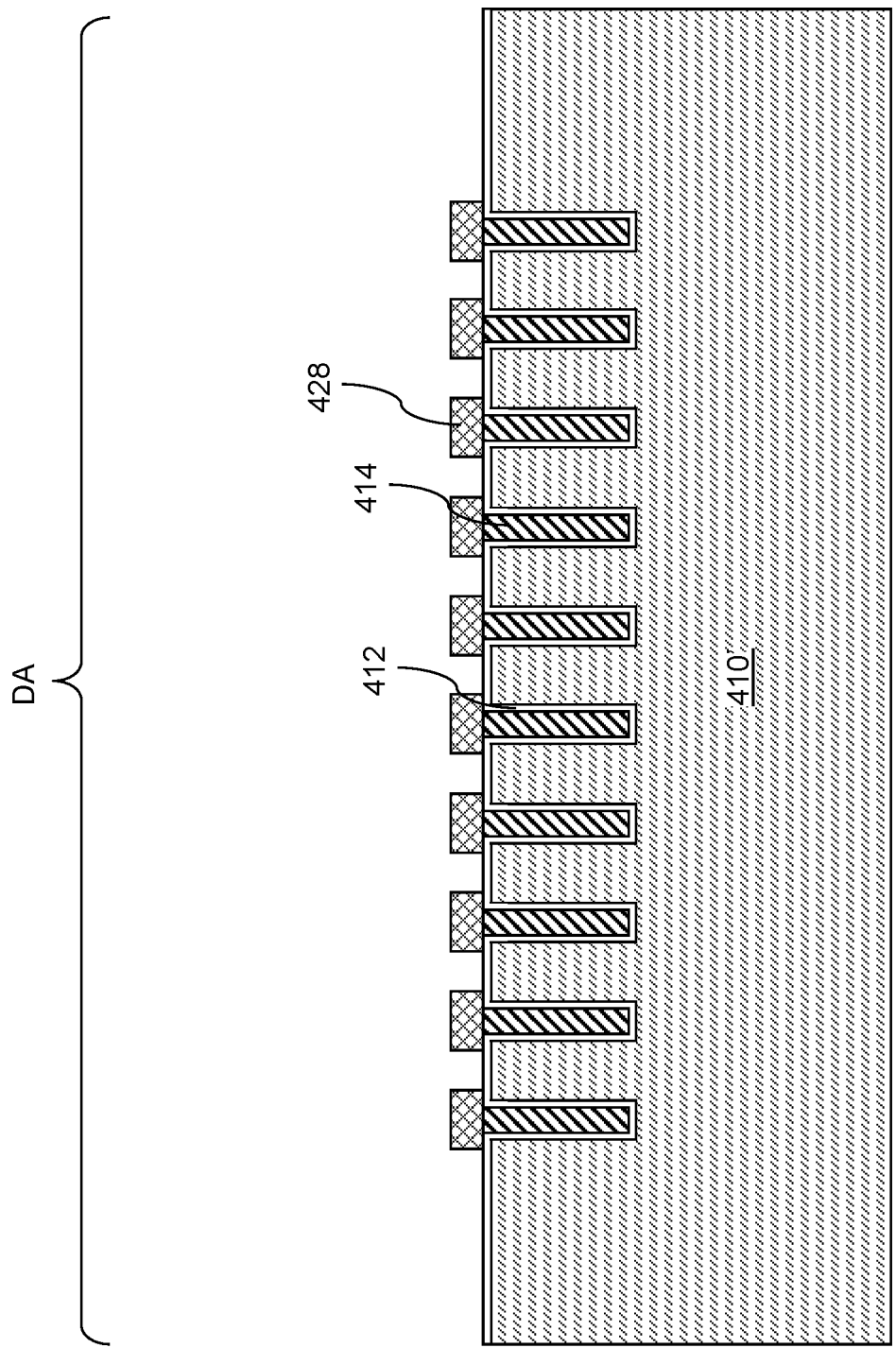

Referring to FIG. 2D, bonding pads 428 may be formed on the through-substrate via structures 414. For example, an underbump metallization (UBM) layer stack may be deposited over the through-substrate via structures 414 and the dielectric liner 412. The order of material layers within the UBM layer stack is selected such that solder material portions may be subsequently bonded to portions of the bottom surface of the UBM layer stack. Layer stacks that may be used for the UBM layer stack include, but are not limited to, stacks of Cr/Cr-Cu/Cu/Au, Cr/Cr-Cu/Cu, TiW/Cr/Cu, Ti/Ni/Au, and Cr/Cu/Au. Other suitable materials are within the contemplated scope of disclosure. The thickness of the UBM layer stack may be in a range from 1 microns to 10 microns, such as from 2 microns to 5 microns, although lesser and greater thicknesses may also be used.

A photoresist layer (not shown) may be formed over the UBM layer stack, and may be lithographically patterned to form openings therethrough. The pattern of the openings in the photoresist layer may be the same as the pattern of bonding structures to be subsequently formed. For example, the openings in the photoresist layer may have a horizontal cross-sectional shape of a circle, an oval, a rectangle, a rounded rectangle, or any other two-dimensional curvilinear shape having a closed periphery. A lateral dimension of each opening (such as a diameter) may be in a range from 10 microns to 60 microns, although lesser and greater dimensions may also be used. An electroplating process may be performed to form copper pads in the openings in the photoresist layer. The thickness of the copper pads may be in a range from 10 microns to 60 microns, although lesser and greater thicknesses may also be used.

The photoresist layer may be subsequently removed, for example, by ashing. Portions of the UBM stack that are not masked by the copper pads may be removed by an etch process, which may comprise an isotropic etch process or an anisotropic etch process. Each contiguous combination of a remaining portion of the UBM stack and a copper pad constitutes a bonding structure. The bonding structures may be subsequently used to attach an interposer to a packaging substrate. In this embodiment, the bonding structures are herein referred to as interposer bonding pads 428. A two-dimensional array of interposer bonding pads 428 may be formed.

Referring to FIG. 2E, an adhesive layer 311 may be applied to the dielectric liner 412. A carrier substrate 310 may be attached to the semiconductor substrate 410' through the adhesive layer 311. The carrier wafer 310 may include an optically transparent substrate such as a glass substrate or a sapphire substrate, or may comprise a semiconductor substrate such as a silicon substrate. The diameter of the carrier wafer 310 may be in a range from 100 mm to 450 mm, although lesser and greater diameters may be used. Generally, the carrier wafer 310 may have the same lateral dimension as the semiconductor substrate 410'. The thickness of the carrier wafer 310 may be in a range from 500 microns to 2,000 microns, although lesser and greater thicknesses may also be used. The adhesive layer 311 may be a light-to-heat conversion (LTHC) layer. Alternatively, the adhesive layer 311 may include a thermally decomposing adhesive material. A plurality of through-substrate via structures 414 vertically extend into the semiconductor substrate 410' within each die area DA.

FIGS. 3A-3D are sequential vertical cross-sectional views of a die area DA during formation of dielectric material layers 450, metal interconnect structures 480, on-interposer 400 bump structures, and solder material portions 438 according to an embodiment of the present disclosure.

Referring to FIG. 3A, the semiconductor substrate 410' may be thinned by removing the backside portion of the semiconductor substrate 410' that is distal from the carrier wafer 310. The semiconductor substrate as thinned by the thinning process is herein referred to as a thinned semiconductor substrate 410, or as a semiconductor substrate 410 hereafter. A combination of a grinding process and a polishing process may be used to remove the backside portion of the semiconductor substrate 410. The through-substrate via structures 414 may be used as a stopping structure during the polishing process. Horizontal end surfaces of the through-substrate via structures 414 may be physically exposed after thinning the semiconductor substrate 410.

Figure 3B:
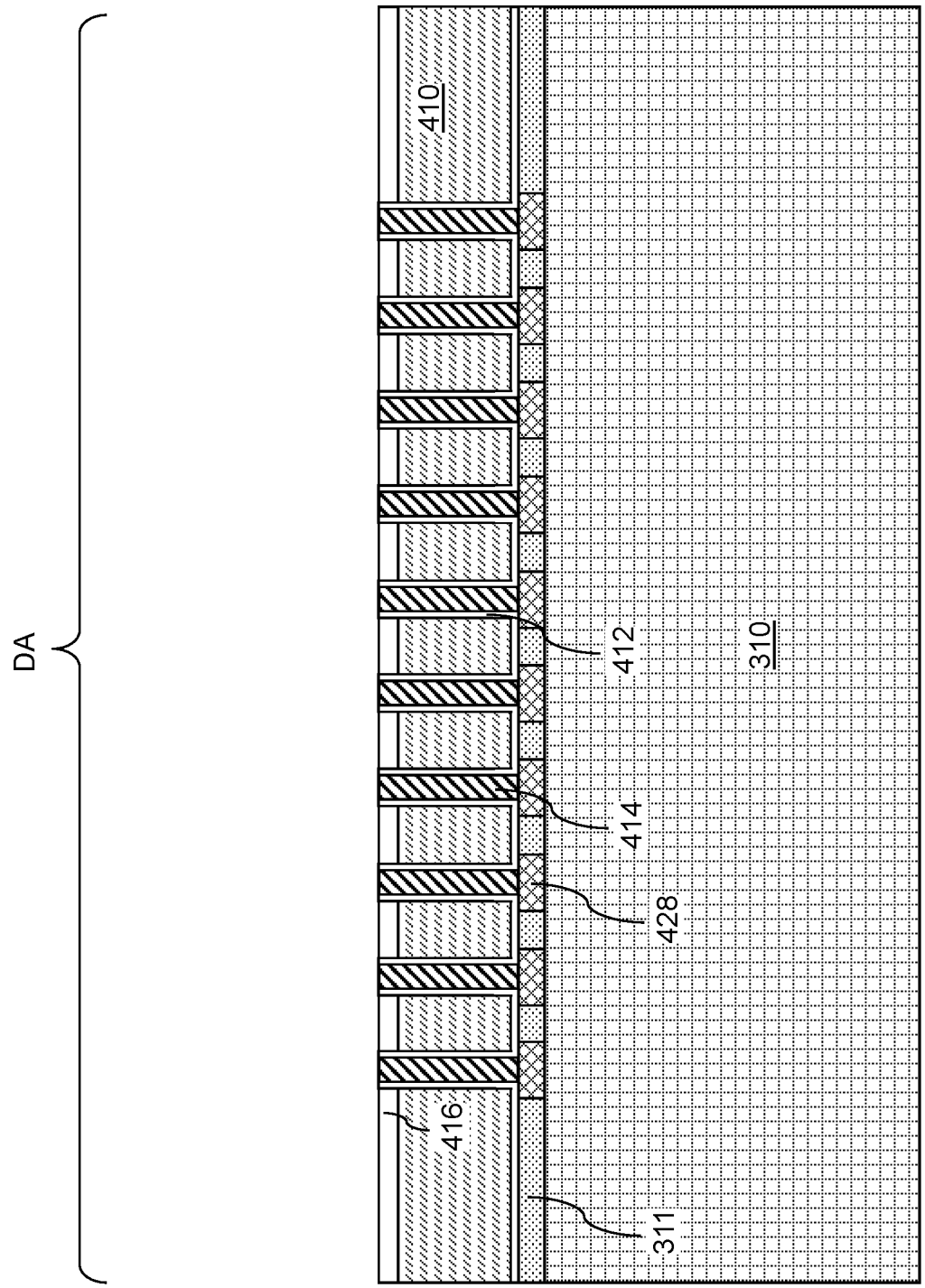

Referring to FIG. 3B, the semiconductor material of the semiconductor substrate 410 may be vertically recessed, for example, by performing a selective etch process that etches the semiconductor material of the semiconductor substrate 410 selective to the material of the through-substrate via structures 414 and the dielectric liner 412. For example, a wet etch using potassium hydroxide (KOH) may be performed to vertically recess the physically exposed horizontal surface of the semiconductor substrate 410. A dielectric material may be deposited over the recessed horizontal surface of the semiconductor substrate 410, for example, by chemical vapor deposition. The dielectric material may comprise silicon oxide or silicon nitride. Excess portions of the dielectric material may be removed from above the horizontal plane including the horizontal top surfaces (i.e., planar end surfaces) of the through-substrate via structures 414, for example, by performing a chemical mechanical polishing (CMP) process. The remaining portion of the dielectric material constitutes a capping dielectric layer 416, which may have a physically exposed horizontal surface that is coplanar with the horizontal top surfaces of the through-substrate via structures 414.

Figure 3C:
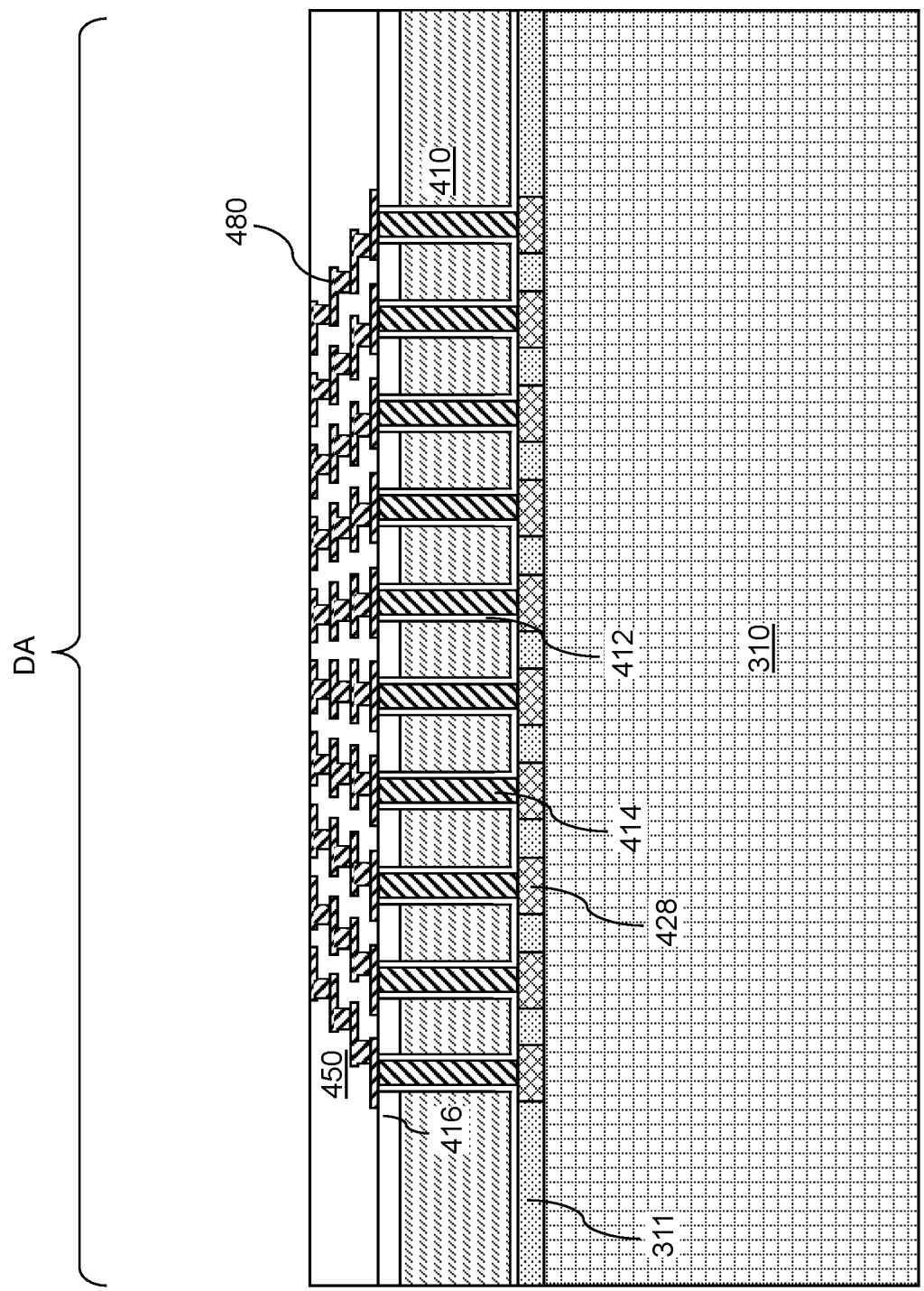

Referring to FIG. 3C, metal interconnect structures 480 embedded within dielectric material layers 450 may be formed. Each dielectric material layer 450 may be formed over the capping dielectric layer 416 and any underlying dielectric material layer 450 (if present), and may be patterned to form line cavities and/or via cavities therein. The line cavities and/or the via cavities may be filled with at least one metallic material, for example, by depositing and performing a damascene planarization process to form metal lines and via structures, which constitute a subset of the metal interconnect structures 480. A set of processing steps including a dielectric material layer deposition process, a dielectric material layer patterning process, and a metal deposition and patterning process may be repeated performed to form the metal interconnect structures 480 and the dielectric material layers 450. The total number of wiring levels (i.e., the total number of levels of metal lines) may be in a range from 1 to 20, such as from 2 to 10, although a greater number of wiring levels may also be used.

Figure 3D:
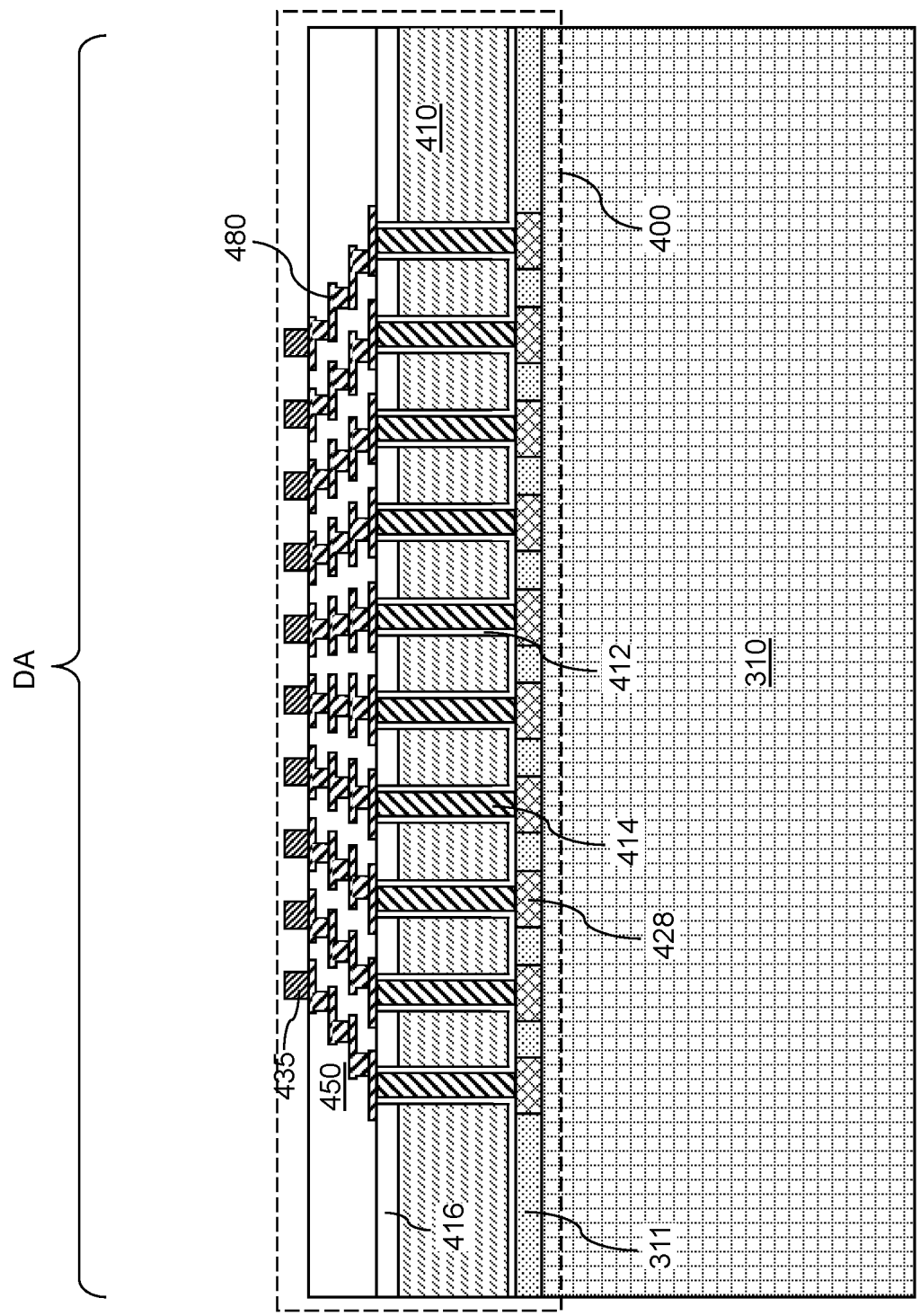

Referring to FIG. 3D, bump structures may be formed over the topmost level of the metal interconnect structures 480. The bump structures are formed as portions of a respective interposer, and are herein referred to as on-interposer bump structures 435. Each portion of the exemplary structure other than the carrier wafer 310 and the adhesive layer 311 that is located within a respective die area DA constitutes an interposer 400, which may be a semiconductor interposer including a semiconductor substrate 410. In embodiments in which the semiconductor substrate 410 is a silicon substrate, the interposer 400 may be a silicon interposer. The exemplary structure comprises a two-dimensional array of interposers 400 located on a carrier wafer 310 and attached to the carrier wafer 310 through an adhesive layer 311. Generally, a two-dimensional array of interposers 400 may be formed on a carrier wafer 310. Each of the interposers 400 comprises a respective set of through-substrate via structures 414 and a respective set of metal interconnect structures 480 formed within dielectric material layers 450.

In one embodiment, the on-interposer bump structures 435 may be formed as microbump structures configured for microbump bonding (i.e., C2 bonding). In this embodiment, the on-interposer bump structures 435 may be formed as pillar structures having a height in a range from 10 microns to 100 microns, although lesser or greater heights may also be used. In one embodiment, the lateral dimension (such as a diameter) of each microbump structure may be in a range from 10 microns to 50 microns, although lesser and greater heights may also be used. The pitch of the array of microbump structures may be in a range from 20 microns to 100 microns, although lesser and greater pitches may also be used.

Solder material portions 438 (see FIG. 4B) may be applied to the on-interposer bump structures 435.

Figure 4A:
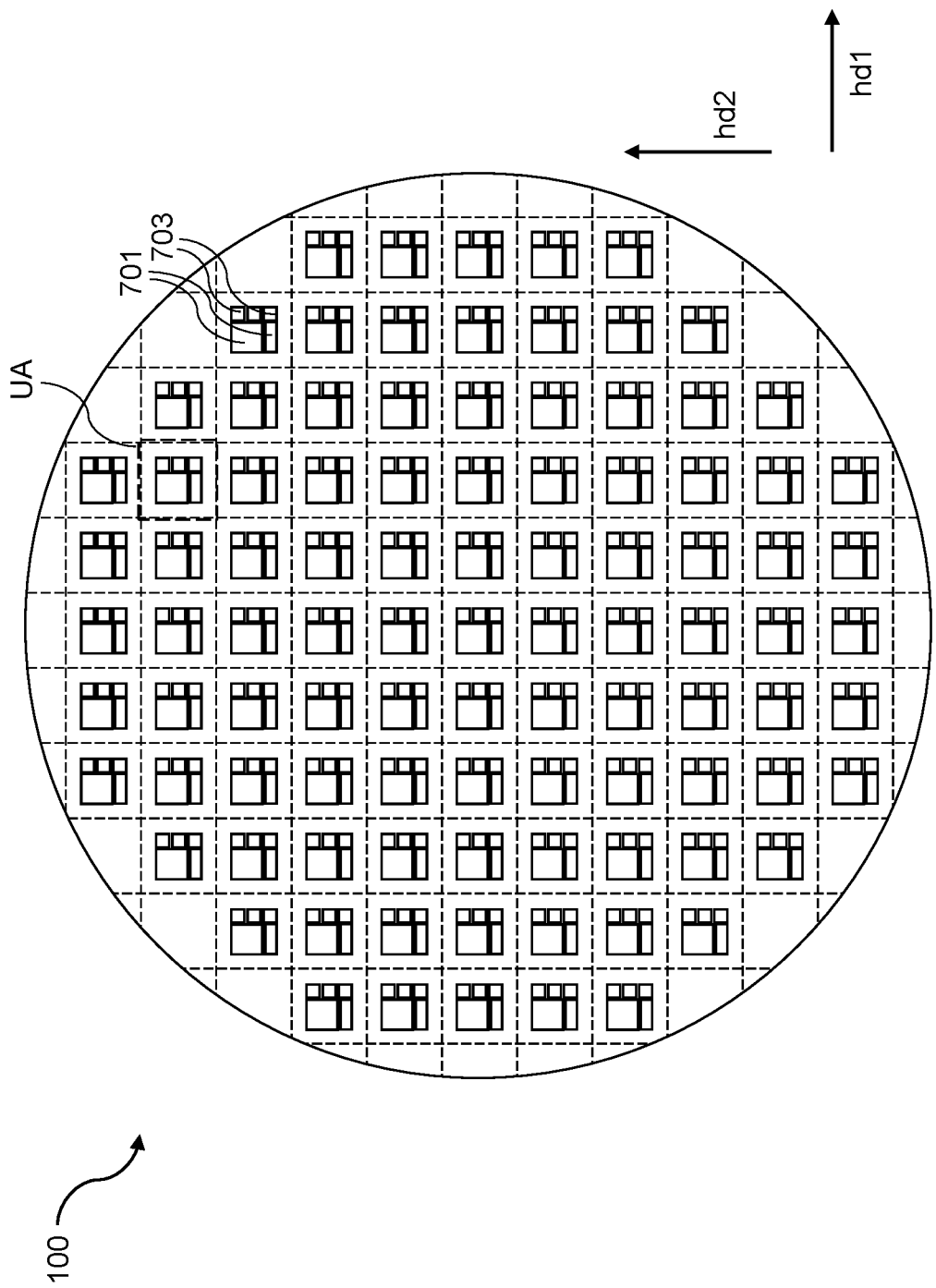
FIG. 4A is a top-down view of the exemplary structure after attaching a set of semiconductor dies to each interposer within a two-dimensional array of interposers in the exemplary structure according to an embodiment of the present disclosure.
Figure 4B:
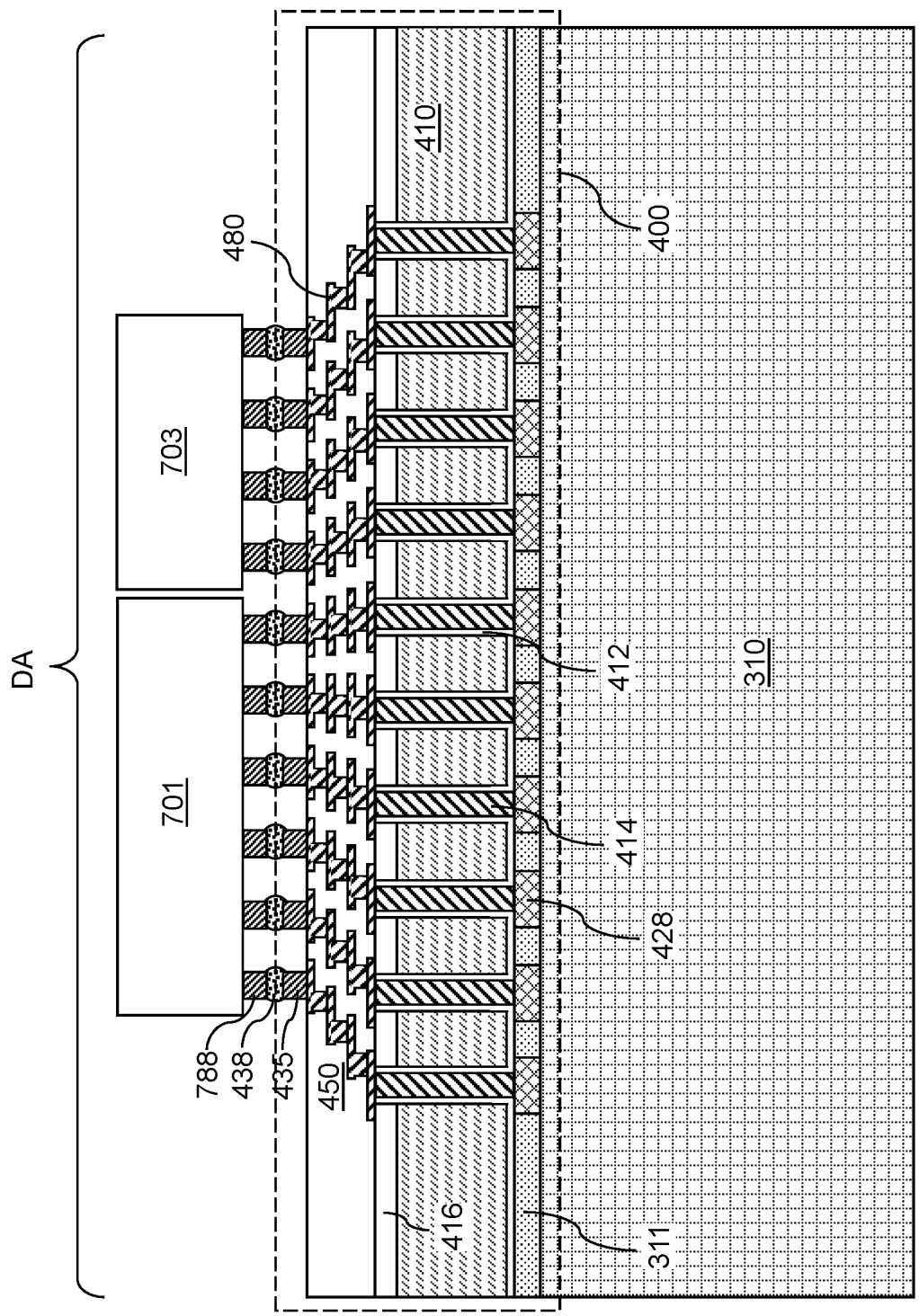
FIG. 4B is a vertical cross-sectional view of a die area within the exemplary structure of FIG. 4A.

Referring to FIGS. 4A and 4B, a set of at least one semiconductor die (701, 703) may be attached to each interposer 400 within the two-dimensional array of interposers 400. Each set of at least one semiconductor die (701, 703) includes at least one semiconductor die, which may be a single semiconductor die or a plurality of semiconductor dies. Each set of at least one semiconductor die (701, 703) may include any set of at least one semiconductor die known in the art. In one embodiment, each set of at least one semiconductor die (701, 703) may comprise a plurality of semiconductor dies (701, 703). For example, each set of at least one semiconductor die (701, 703) may include at least one system-on-chip (SoC) die 701 and/or at least one memory die 703. Each SoC die 701 may comprise an application processor die, a central processing unit die, or a graphic processing unit die. In one embodiment, the at least one memory die 703 may comprise a high bandwidth memory (HBM) die that includes a vertical stack of static random access memory dies. In one embodiment, the at least one semiconductor die (701, 703) may include at least one system-on-chip (SoC) die 701 and at least one high bandwidth memory (HBM) die. Each HBM die may comprise a vertical stack of static random access memory (SRAM) dies that are interconnected to one another through arrays of microbumps and are laterally surrounded by a respective molding material enclosure frame.

Each semiconductor die (701, 703) may comprise a respective array of on-die bump structures 788. Solder material portions may be applied to the on-die bump structures 788 of the semiconductor dies (701, 703), or may be applied to the on-interposer bump structures 435. The solder material portions are herein referred to as die-interposer-bonding (DIB) solder material portions 438, or as first solder material portions 438. Each of the semiconductor dies (701, 703) may be positioned in a face-down position such that on-die bump structures 788 face the on-interposer bump structures 435. Placement of the semiconductor dies (701, 703) may be performed using a pick and place apparatus such that each of the on-die bump structures 788 may face a respective one of the on-interposer bump structures 435. Each set of at least one semiconductor die (701, 703) may be placed within a respective die area DA, which is an area of an underlying interposer 400. A DIB solder material portion 438 is attached to one of the on-die bump structure 788 and the on-interposer bump structure 435 for each facing pair of an on-die bump structure 788 and an on-interposer bump structure 435. A two-dimensional array of sets of at least one semiconductor die (701, 703) may be attached to the two-dimensional array of interposers 400 through the solder material portions 438. A reconstituted wafer 100 may be formed, which includes the two-dimensional array of interposers 400 and the two-dimensional array of set of at least one semiconductor die (701, 703).

Figure 5A:
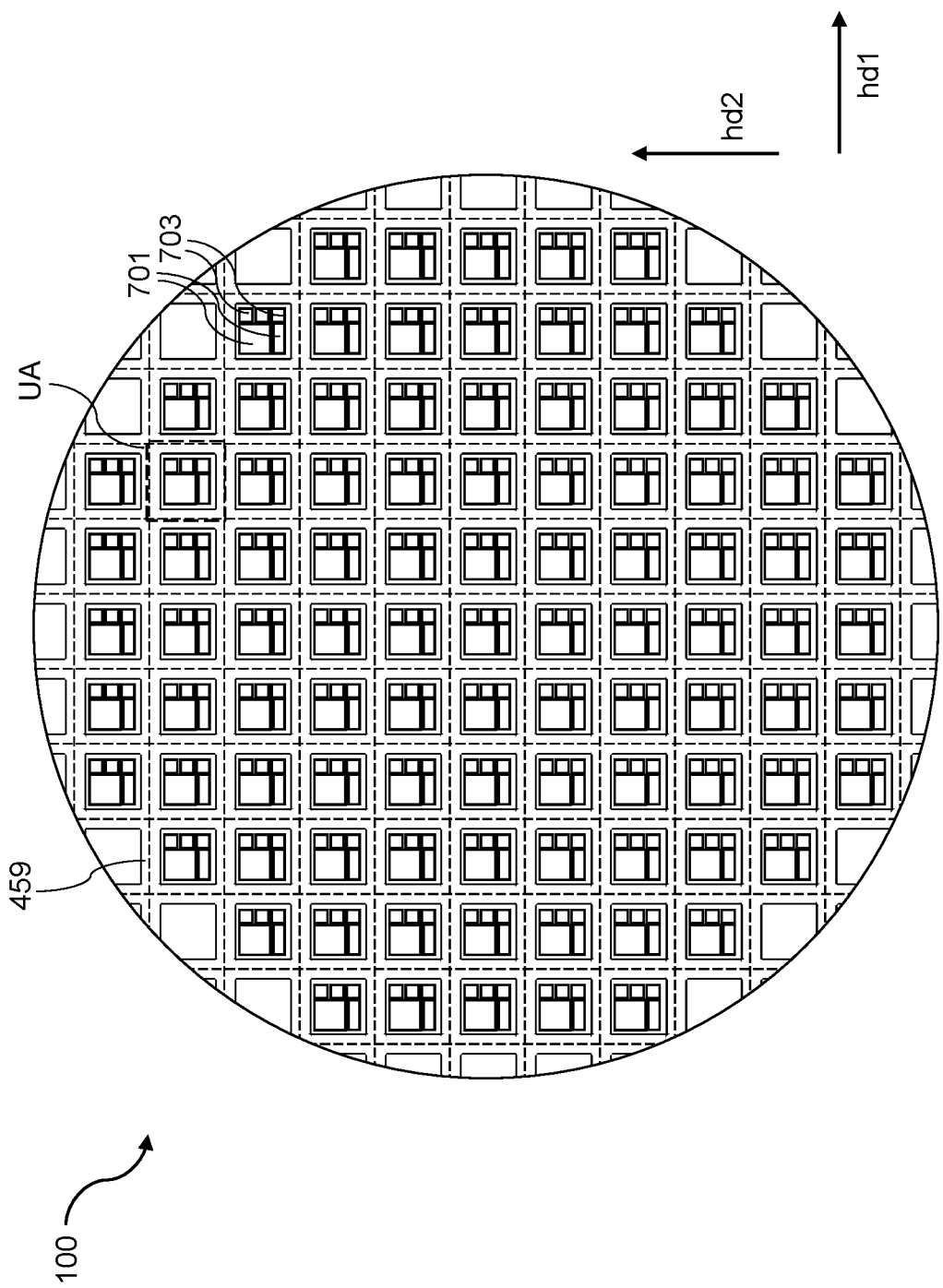
FIG. 5A is a top-down view of the exemplary structure after formation of grooves along dicing channels in the two-dimensional array of interposers in the exemplary structure according to an embodiment of the present disclosure.
Figure 5B:
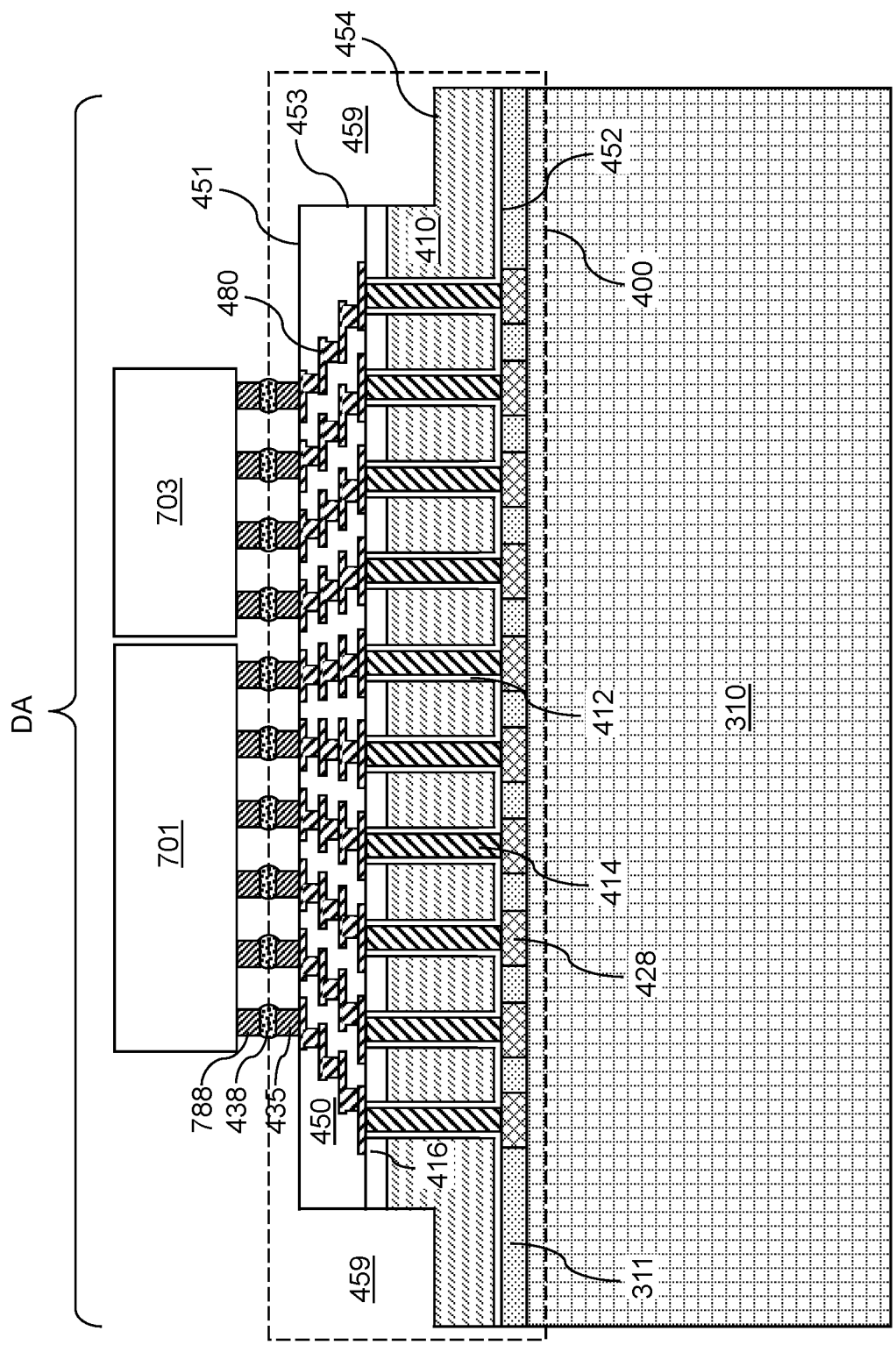
FIG. 5B is a vertical cross-sectional view of a die area within the exemplary structure of FIG. 5A.

Referring to FIGS. 5A and 5B, grooves 459 may be formed along dicing channels in the two-dimensional array of interposers 400. According to an aspect of the present disclosure, the grooves 459 may have a width that is greater than the width of the dicing channels at least by 20 microns. In one embodiment, the width of the grooves 459 may be greater than the width of the dicing channels for the interposers 400 by twice the lateral dimension of horizontal steps to be formed along the periphery of each interposer 400. The difference between the width of the grooves 459 and the width of the dicing channels may be in a range from 20 microns to 6 mm, such as from microns to 2 mm, although lesser and greater differences may also be used.

The depth of the grooves 459 is less than the thickness of each interposer 400. In one embodiment, the depth of the grooves 459 may be greater than the sum of the thickness of the dielectric material layers 450 and the capping dielectric layer 416. In this embodiment, the grooves 459 may vertically extend through the dielectric material layers 450, and may extend into an upper portion of the semiconductor substrate 410. A horizontal surface and sidewalls of the semiconductor substrate 410 may be physically exposed to each groove 459. In one embodiment, the grooves extend into an upper portion of the semiconductor substrate, and do not extend through the semiconductor substrate 410.

In one embodiment, the grooves 459 may be formed by a cutter or a grinder having suitable cutting edges. The removal rate of the materials of the interposers 400 may be selected to minimize stress cracking of the interposers 400. In one embodiment, a rotating blade having a width that is the same as the width of the grooves 459 to be formed may be used to cut the grooves 459 in the upper portion of the reconstituted wafer 100.

After formation of the grooves 459, surfaces of each interposer 400 include a first planar surface 451 that faces the set of at least one semiconductor die (701, 703), a set of non-horizontal surfaces 453 having a top periphery that are adjoined to a periphery of the first planar surface 451, and a frame-shaped surface 454 adjoined to a bottom periphery of the set of non-horizontal surfaces 453. Each interposer 400 may comprise a second planar surface 452 in contact with the adhesive layer 311. In one embodiment, the set of non-horizontal surfaces 453 may be vertical surfaces. In one embodiment, the frame-shaped surface 454 may comprise a horizontal frame-shaped surface. As used herein, a frame-shaped surface refers to a surface having an inner periphery and an outer periphery. At this processing step, the outer periphery of each frame-shaped surface 454 may be defined as the intersection of the recessed surface of the interposer 400 with vertical planes that define the die area DA.

The profiles of surfaces defining the boundaries of the grooves 459 may, or may not, be straight, and may, or may not, be horizontal or vertical. FIGS. 5C-5F illustrate vertical cross-sectional views of a die area within alternative configurations of the exemplary structure at a processing step corresponding to the processing steps of FIGS. 5A and 5B. Generally, the sidewalls of the grooves 459 may comprise vertical surfaces, tapered surfaces, or concave surfaces, and bottom surfaces of the grooves 459 may comprise horizontal surfaces or concave surfaces.

Figure 5C:
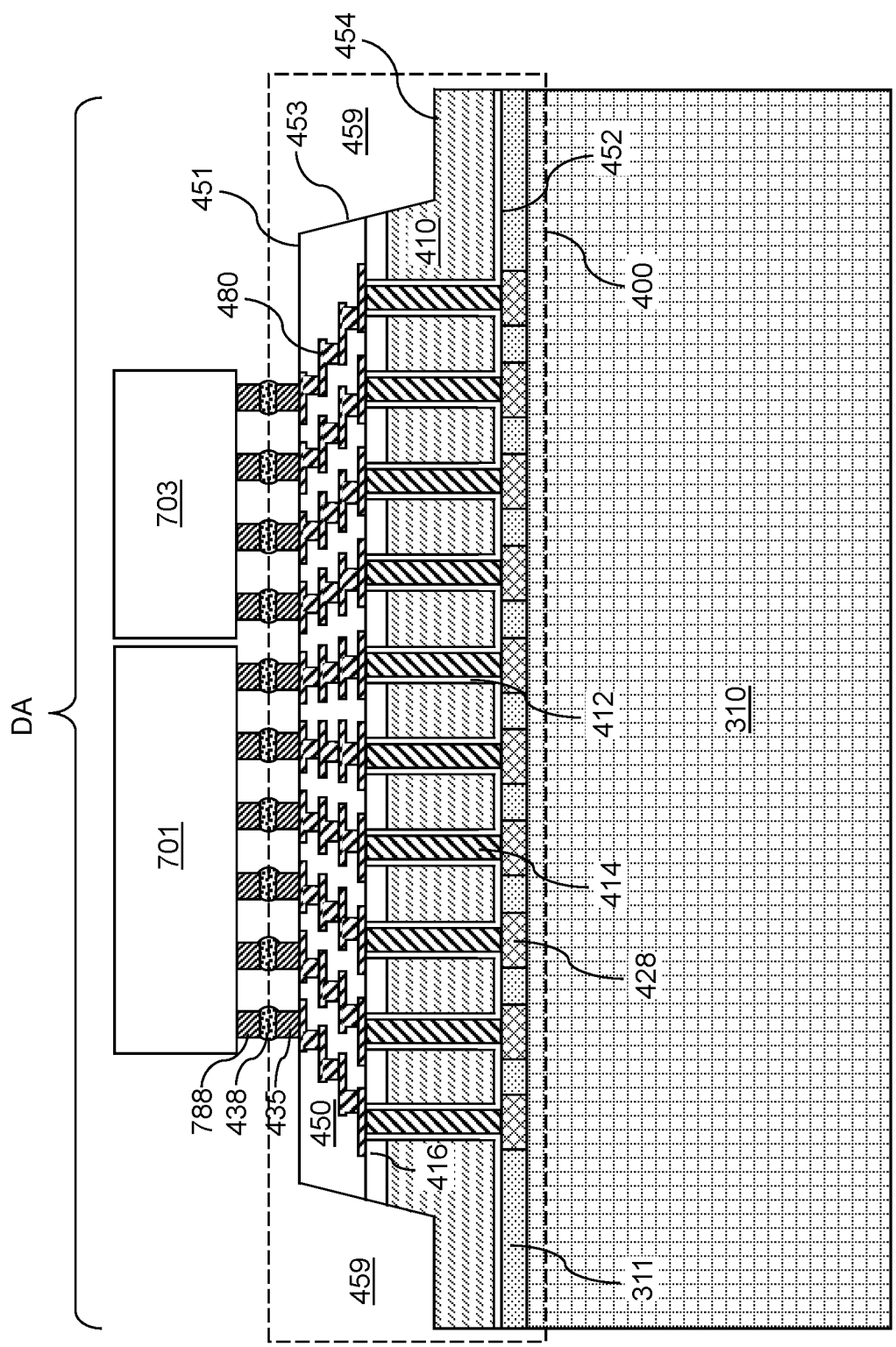
FIGS. 5C-5F are vertical cross-sectional views of a die area within alternative configurations of the exemplary structure at a processing step corresponding to the processing steps of FIGS. 5A and 5B according to embodiments of the present disclosure.

Referring to FIG. 5C, a first alternative configuration of the exemplary structure illustrates a set of non-horizontal surfaces 453 that are straight tapered surfaces. The frame-shaped surface 454 may be a horizontal surface.

Figure 5D:
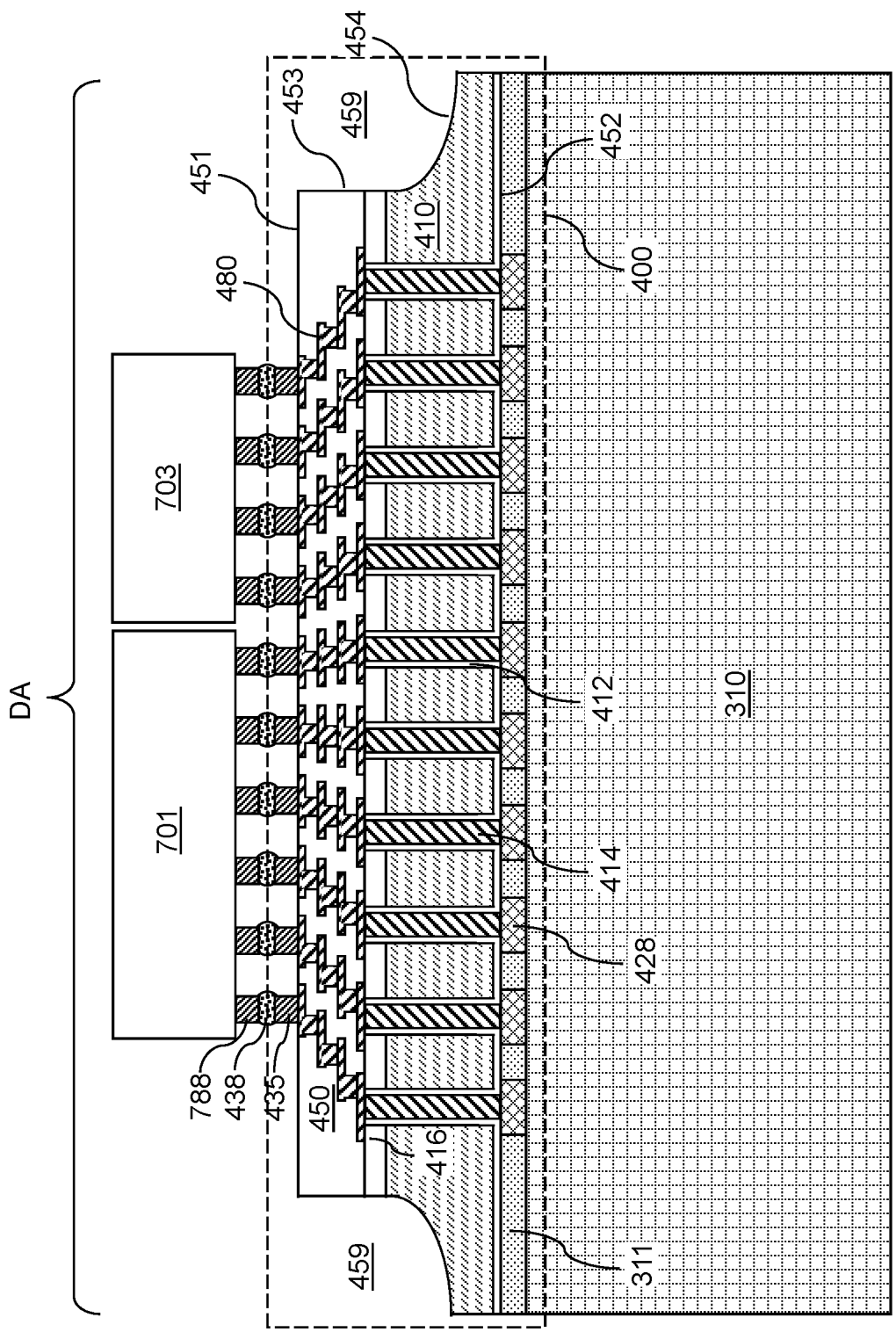

Referring to FIG. 5D, a second alternative configuration of the exemplary structure illustrates a frame-shaped surface 454 having a concave profile. The set of non-horizontal surfaces 453 may be vertical, or may be tapered.

Figure 5E:
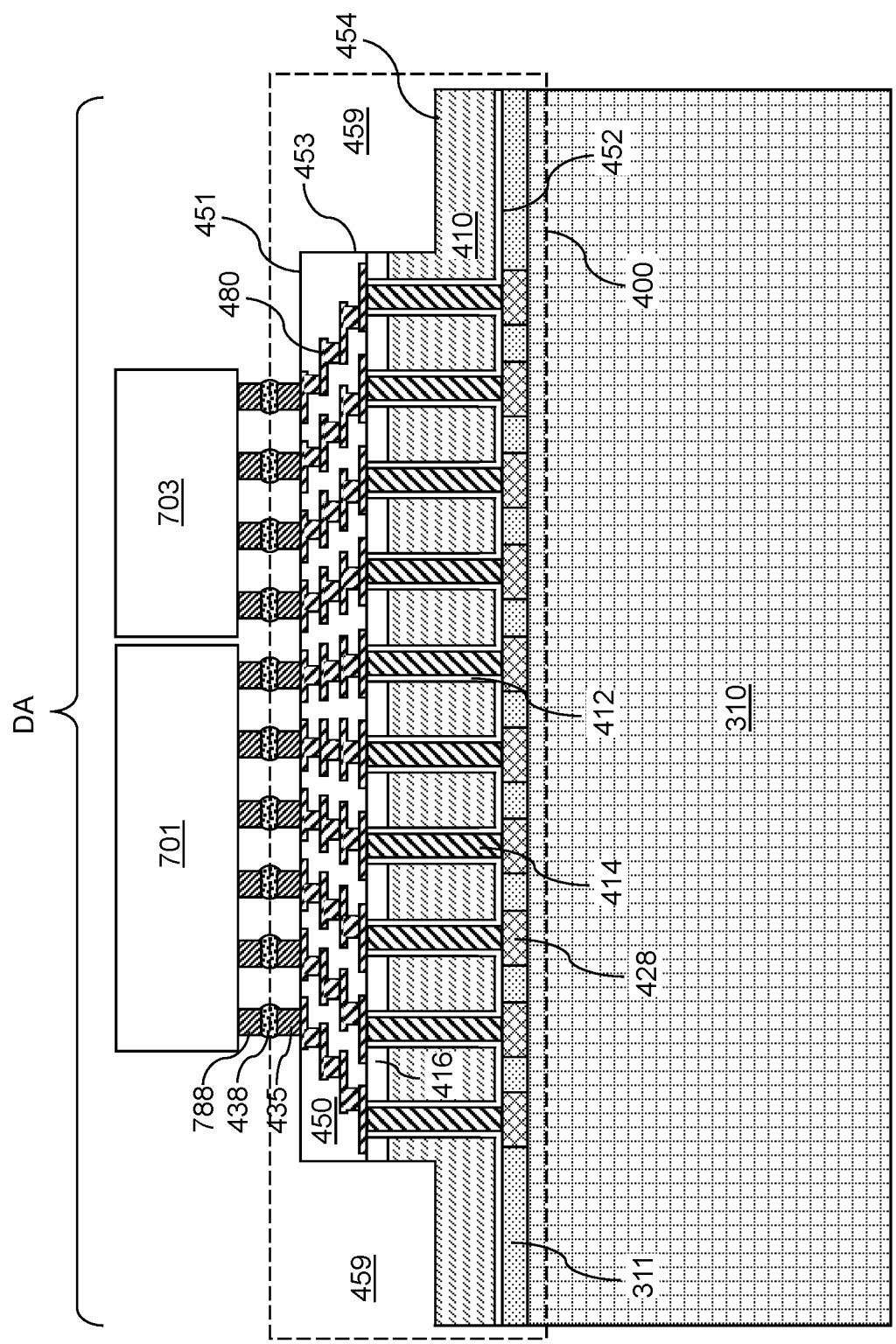

Referring to FIG. 5E, a third alterative configuration of the exemplary structure illustrates a widened frame-shaped surface 454. Generally, the frame-shaped surface 454 may be widened as long as the entirety of the at least one semiconductor die (701, 703) is positioned within the area defined by the inner periphery of the frame-shaped surface 454.

Figure 5F:
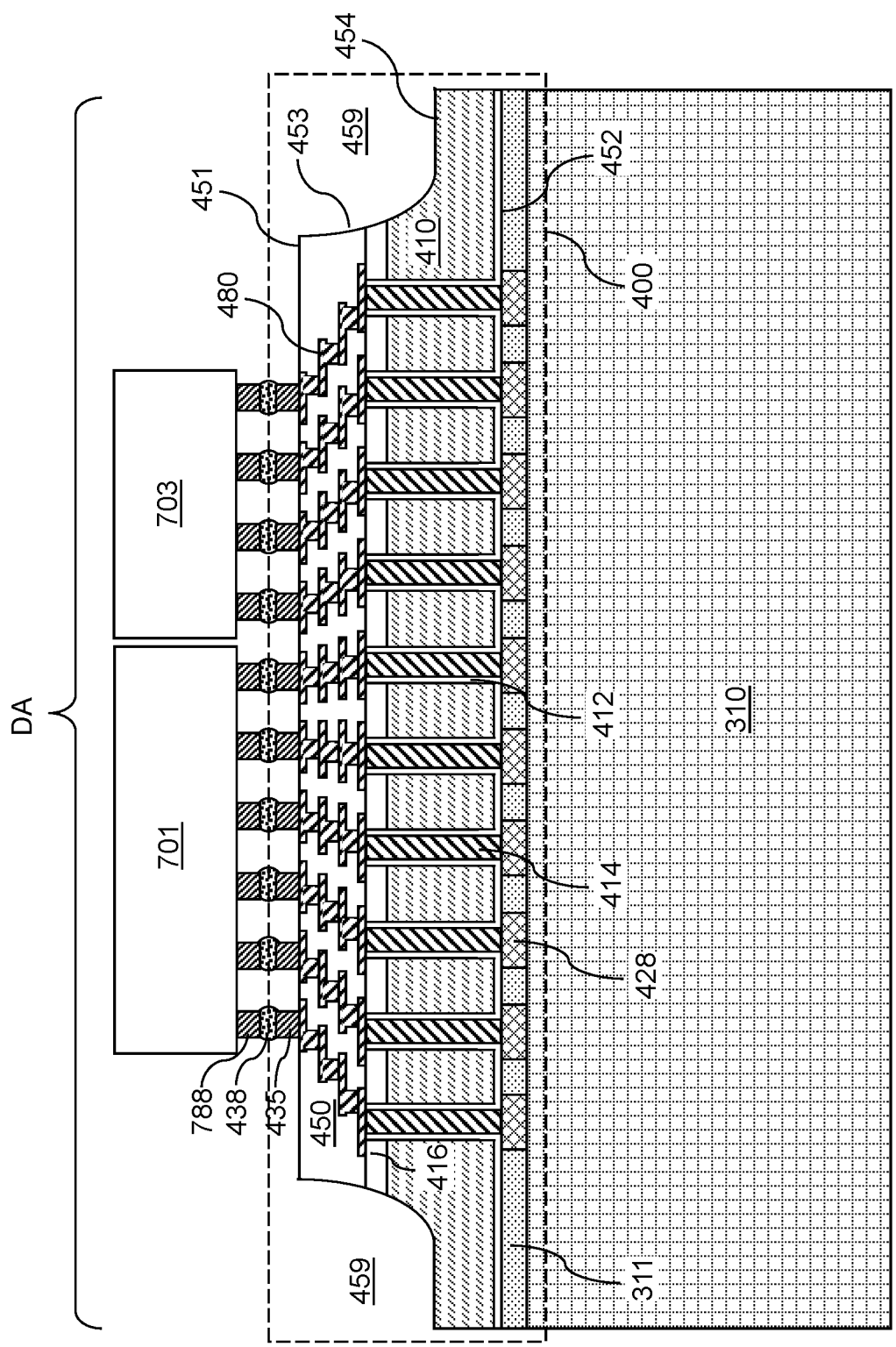

Referring to FIG. 5F, a fourth alternative configuration of the exemplary structure illustrates a set of non-horizontal surfaces 454 that are formed as contoured surfaces such as concave surfaces.

Referring collectively to FIGS. 5A-5F, at least one semiconductor die (701, 703) may be attached to an interposer 400 through a respective array of solder material portions 438. Each interposer 400 may comprise a set of non-horizontal surfaces 453. The set of non-horizontal surfaces 453 comprise a set of vertical surfaces, a set of concave surfaces, or a set of tapered surfaces having a respective taper angle that is not greater than 45 degrees with respective to a vertical direction. Each interposer 400 may have a frame-shaped surface 454. The frame-shaped surface 454 may comprise a planar horizontal surface or a concave surface.

Figure 6:
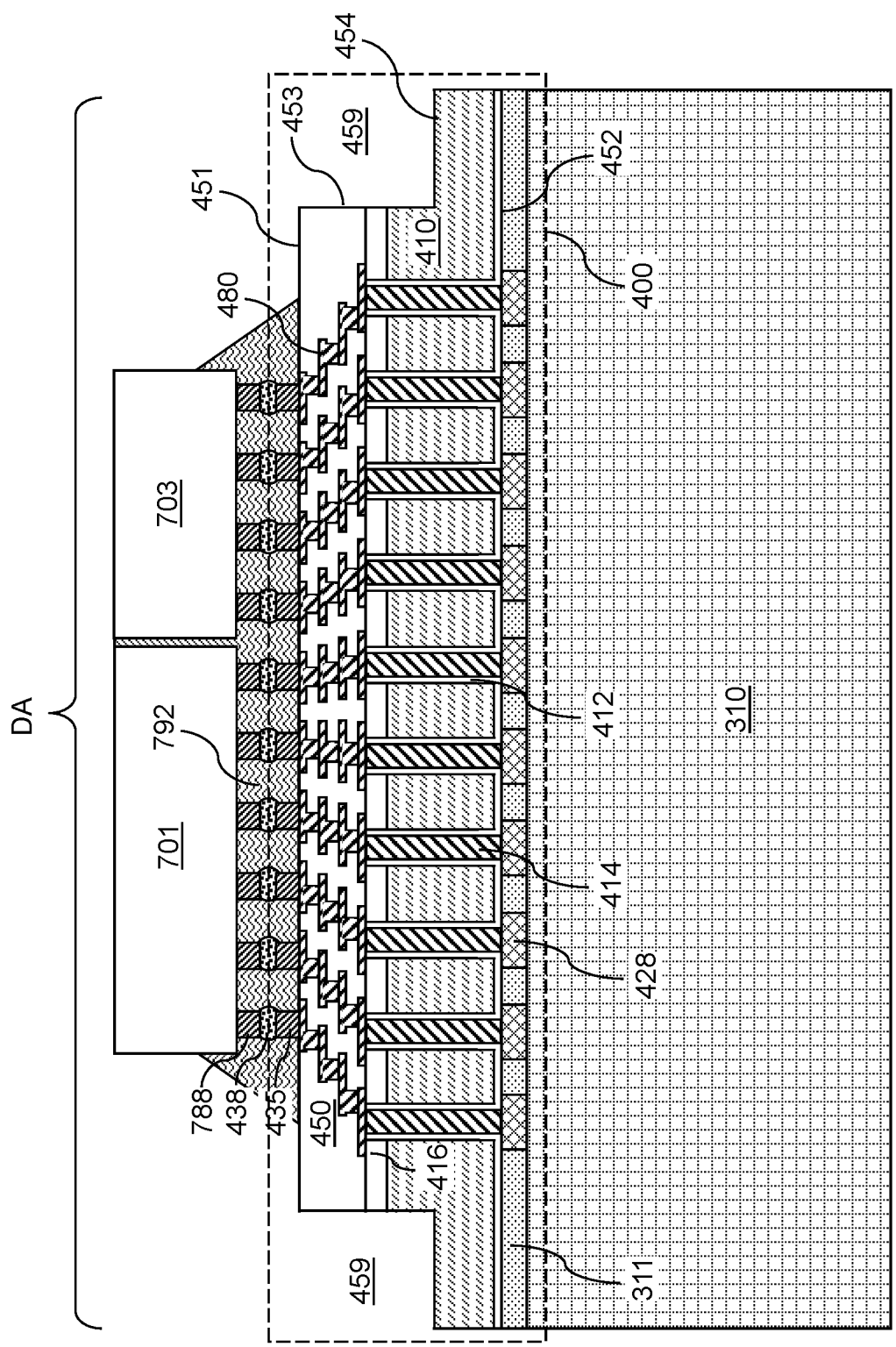
FIG. 6 is a vertical cross-sectional view of a die area within the exemplary structure after formation a first underfill material portion according to an embodiment of the present disclosure.

Referring to FIG. 6, an underfill material portion may be formed between each interposer 400 and a respective overlying set of at least one semiconductor die (701, 703). The underfill material portion is herein referred to as a first underfill material portion 792. A two-dimensional array of first underfill material portions 792 may be formed between the two-dimensional array of interposers 400 and the two-dimensional array of sets of at least one semiconductor die (701, 703). Each of the first underfill material portions 792 may be formed within a mesa region of a respective underlying interposer 400. Each mesa region is a region that is raised above, and is laterally surrounded by, a moat-shaped region of the grooves 459.

In one embodiment, each of the first underfill material portions 792 may be laterally surrounded by the grooves 459, and may be laterally offset from the grooves 459 by a peripheral portion of a planar top surface (such as a first planar surface 451) of a respective one of the interposers 400. In one embodiment, each first underfill material portion 792 may be located between an interposer 400 and at least one semiconductor die (701, 703), and may contact a center portion of a first planar surface 451. A peripheral portion of the first planar surface 451 may be physically exposed. In one embodiment, an outer periphery of the first underfill material portion 792 may be laterally offset inward from the set of non-horizontal surfaces 453 by the width of the peripheral portion of the first planar surface 451. The lateral offset between the outer periphery of the first underfill material portion 792 and the set of non-horizontal surfaces 453 may be advantageously used to mitigate delamination and cracking the first underfill material portion 792 during thermal cycling and product operation, and the reliability of a chip package (such as a fan-out package) to be subsequently formed may be enhanced without increasing the warpage of the chip package.

Figure 7:
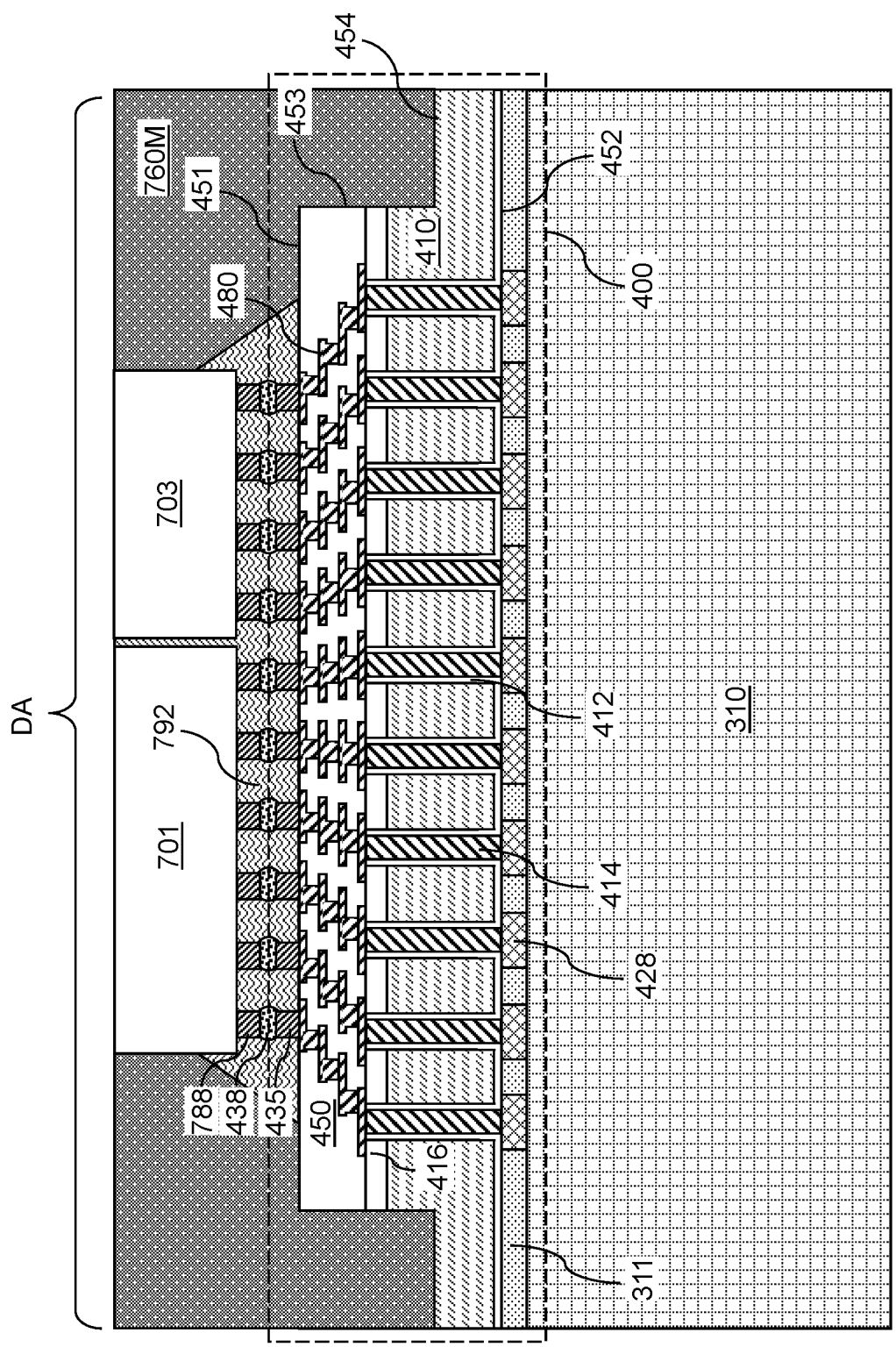
FIG. 7 is a vertical cross-sectional view of a die area within the exemplary structure after formation of a molding compound matrix according to an embodiment of the present disclosure.

Referring to FIG. 7, a molding compound die frame 760 laterally surrounding the underfill material portion 792 and the at least one semiconductor die (701, 703). An encapsulant, such as a molding compound (MC) may be applied into the grooves 459 and around the semiconductor dies (701, 703) to fill the gaps between the interposers 400. The molding compound (MC) may comprise an epoxy-containing compound that may be hardened (i.e., cured) to provide a dielectric material portion having sufficient stiffness and mechanical strength. The MC may include epoxy resin, hardener, silica (as a filler material), and other additives. The MC may be provided in a liquid form or in a solid form depending on the viscosity and flowability. Liquid MC typically provides better handling, good flowability, less voids, better fill, and less flow marks. Solid MC typically provides less cure shrinkage, better stand-off, and less die drift. A high filler content (such as 85% in weight) within an MC may shorten the time in mold, lower the mold shrinkage, and reduce the mold warpage. Uniform filler size distribution in the MC may reduce flow marks, and may enhance flowability.

The MC may be cured at a curing temperature to form a molding compound (MC) matrix 760M. The MC matrix 760 laterally encloses each set of the at least one semiconductor die (701, 703), which may a respective set of a plurality of semiconductor dies (701, 703). The MC matrix 760M may be a continuous material layer that extends across the entirety of the area of the reconstituted wafer overlying the carrier wafer 310. Each portion of the MC matrix 760M that is located within a respective die area DA constitutes a molding compound (MC) die frame. As such, the MC matrix 760M may include a plurality of MC die frames that are adjoined to one another. Excess portions of the MC matrix 760M may be removed from above the horizontal plane including the top surfaces of the semiconductor dies (701, 703) by a planarization process, which may use chemical mechanical planarization (CMP). In embodiments in which a subset of the semiconductor dies (701, 703) protrudes above a horizontal plane including top surfaces of another subset of the semiconductor dies (701, 703), the planarization process may be used to remove protruding portions of the subset of semiconductor dies (701, 703), and to provide a configuration in which all top surfaces of the semiconductor dies (701, 703) and the top surface of the MC matrix 760M are formed within a same horizontal plane.

A reconstituted wafer is formed over the carrier wafer 310. Each portion of the reconstituted wafer located within a die area DA constitutes a fan-out package. According to an aspect of the present disclosure, a peripheral portion of each first planar surface 451 of each interposer 400, an entirety of the set of non-horizontal surfaces 453 of each interposer 400, and an entirety of the frame-shaped surface of each interposer 400 may be in direct contact with the MC matrix 760M.

Figure 8A:
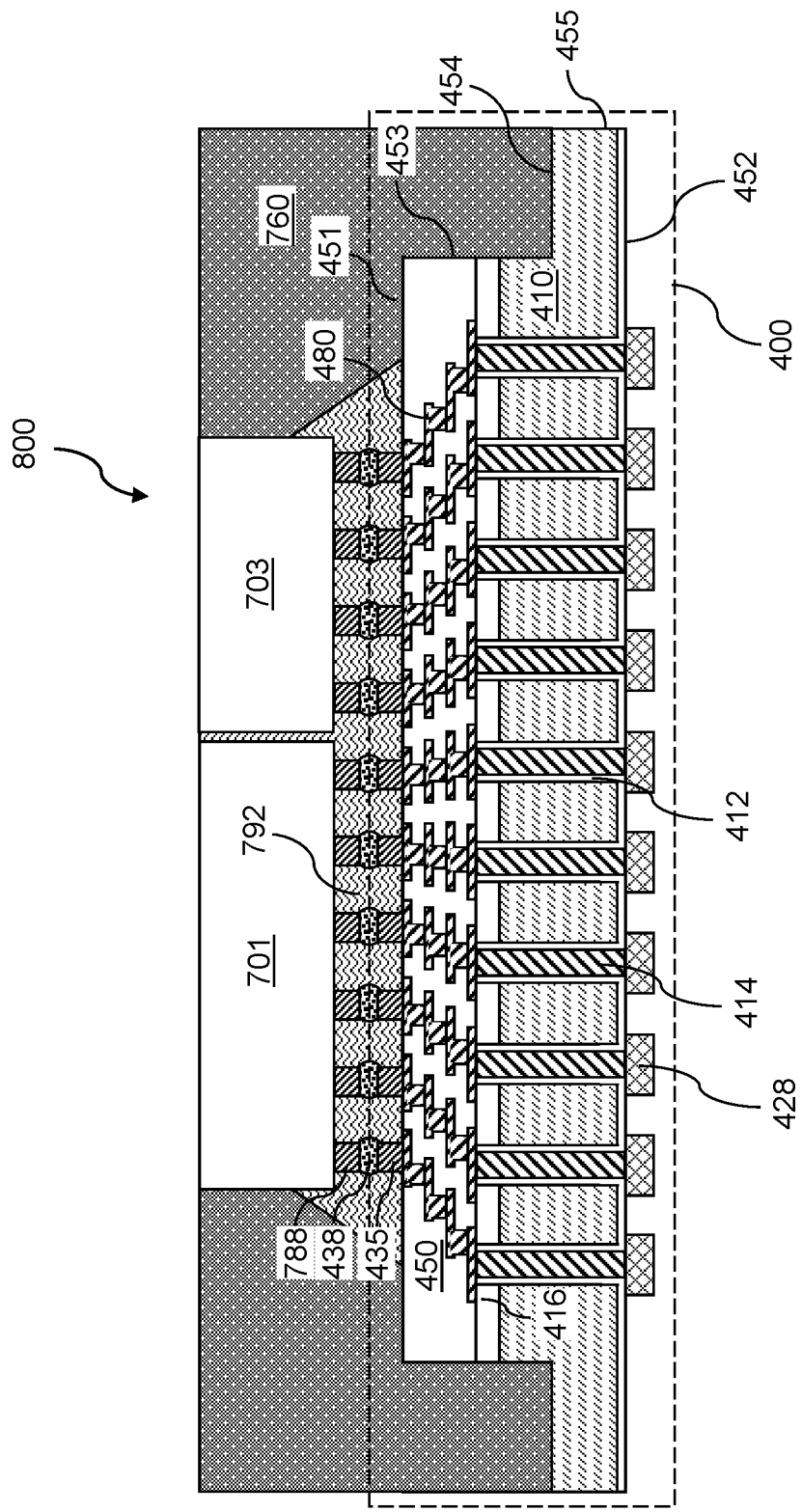
FIG. 8A is a vertical cross-sectional view of a fan-out package formed by detaching the first carrier wafer and dicing a reconstituted wafer in the exemplary structure according to an embodiment of the present disclosure.

Referring to FIG. 8A, the carrier wafer 310 may be detached from the reconstituted wafer including the two-dimensional array of interposers 400, the two-dimensional array of set of at least one semiconductor die (701, 703), the two-dimensional array of first underfill material potions 792, and the MC matrix 760. If the carrier wafer 310 includes an optically transparent material and the adhesive layer 311 comprises a light-to-heat conversion material, irradiation through the carrier wafer 310 may be used to detach the carrier wafer 310. In embodiments in which the adhesive layer 311 comprises a thermally decomposable adhesive material, an anneal process or a laser irradiation may be used to detach the carrier wafer 310. A suitable clean process may be performed to remove residual portions of the adhesive layer 311. A second planar surface 452 of each interposer 400 may be physically exposed. In one embodiment, the second planar surface 452 may be a horizontal surface of a dielectric liner 412.

Subsequently, the reconstituted wafer may be diced into a plurality of singulated chip packages, which may be a plurality of fan-out packages 800. Specifically, the MC matrix 760M and the semiconductor substrate 410 may be diced along the dicing channels into the plurality of fan-out packages 800. The width of the dicing channels is less than the lateral spacing between neighboring sets of non-horizontal surfaces 453. Sidewalls of each interposer 400 may be physically exposed upon singulation of the reconstituted wafer into the interposers 400. The MC matrix 760M is divided into a plurality of molding compound (MC) die frames 760. Each MC die frame 760 is a component of a respective one of the fan-out packages 800. Sidewalls of the MC die frames 760 may be vertically coincident with sidewall of a respective interposer 400 located within a same fan-out package 800.

In one embodiment, the bottom periphery of a set of non-horizontal surfaces 453 coincides within an inner periphery of a frame-shaped surface 454. In one embodiment, each segment of the frame-shaped surface 454 may have the same width throughout, which is herein referred to as a frame width. The bottom periphery of the set of non-horizontal surfaces 453 may be laterally offset inward from the sidewalls 455 of the interposer 400 by a uniform lateral offset distance that equals the frame width. The uniform lateral offset distance (i.e., the frame width) may be less than a minimum lateral distance between the at least one semiconductor die (701, 703) and vertical planes including the sidewalls 455 of the interposer 400. In other words, the at least one semiconductor die (701, 703) may be more distal from the vertical planes including the sidewalls 455 of the interposer 400 than the bottom periphery of the set of non-horizontal surfaces 453. In one embodiment, the at least one semiconductor die (701, 703) may be more distal from the vertical planes including the sidewalls 455 of the interposer 400 than the top periphery of the set of non-horizontal surfaces 453.

In one embodiment, the ratio of the vertical distance between the frame-shaped surface 454 and the second planar surface 452 to the vertical distance between the first planar surface 451 and the second planar surface 452 may be in a range from to 0.99, such as from 0.2 to 0.90, although lesser and greater ratios may also be used. In one embodiment, the ratio of the frame width (i.e., the distance between the vertical planes including the sidewalls 455 of the interposer 400 and the bottom periphery of the set of non-horizontal surfaces 453) to the lateral spacing between the at least one semiconductor die (701, 703) and the vertical planes including the sidewalls 455 of the interposer 400 may be in a range from 0.0125 to 0.8, such as from 0.025 to although lesser and greater ratios may also be used.

Figure 8B:
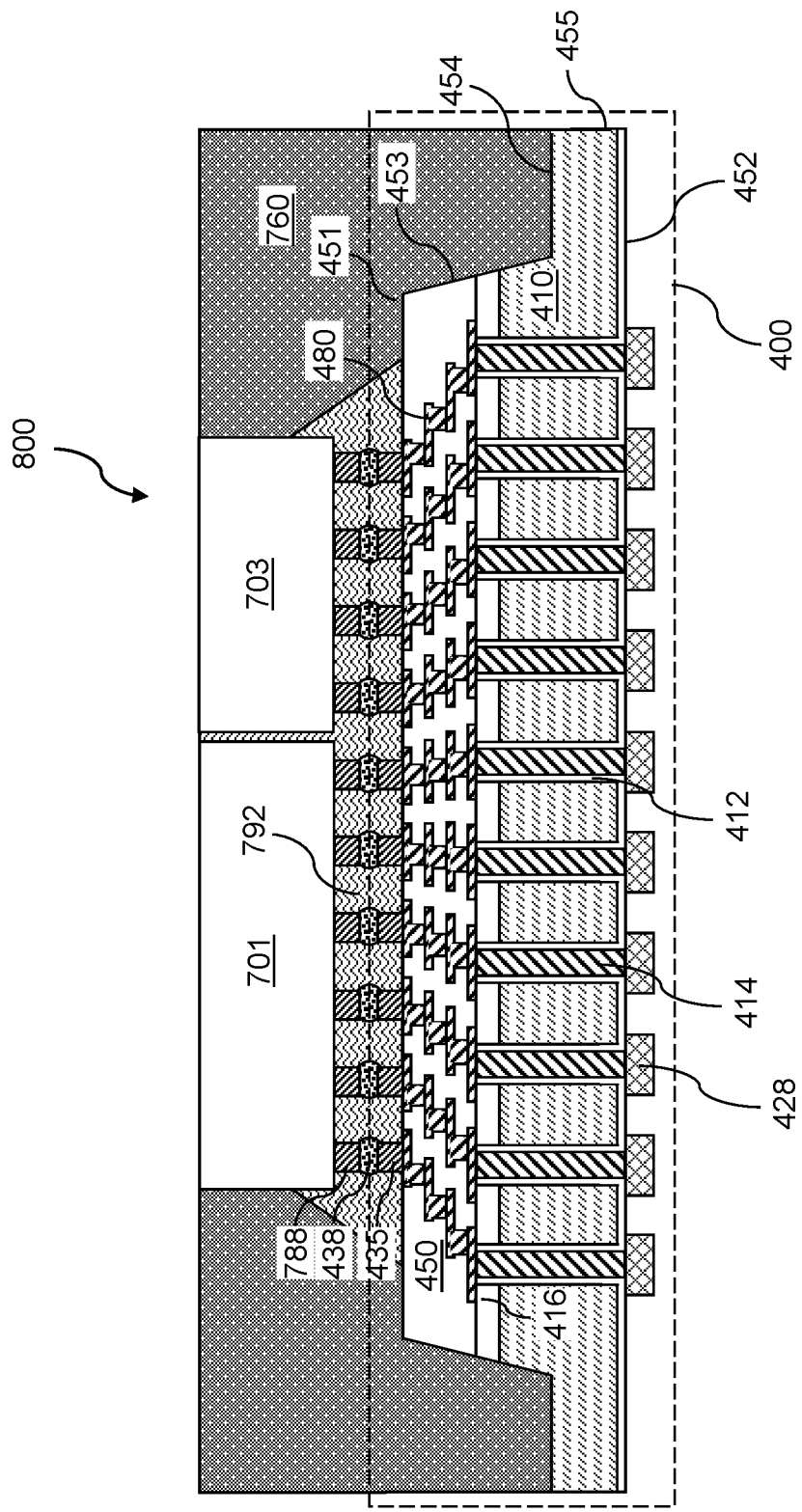
FIGS. 8B-8E are vertical cross-sectional views of alternative embodiments of a fan-out package that may be provided at a processing step corresponding to the processing steps of FIG. 8A according to an embodiment of the present disclosure.
Figure 8C:
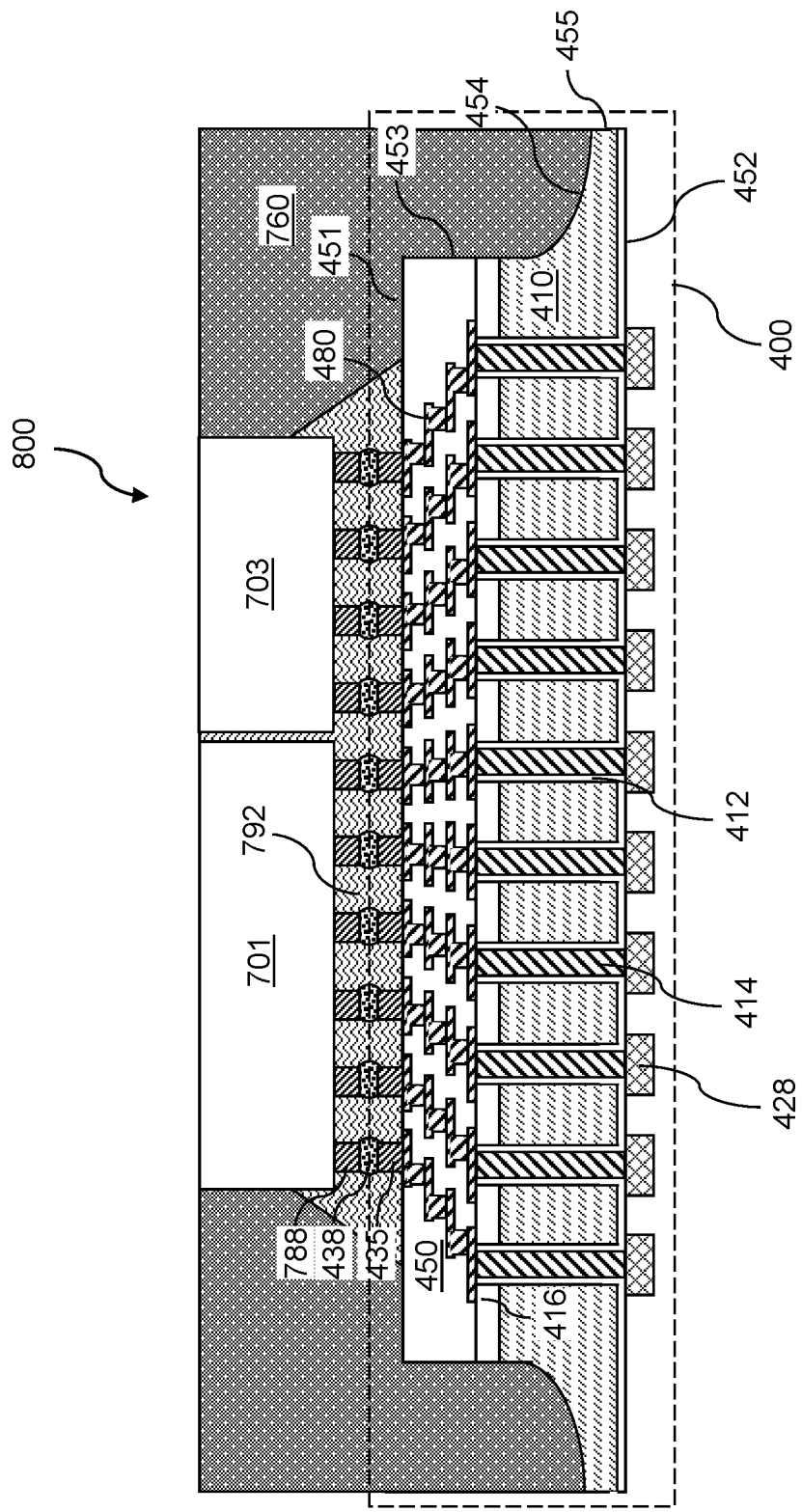
Figure 8D:
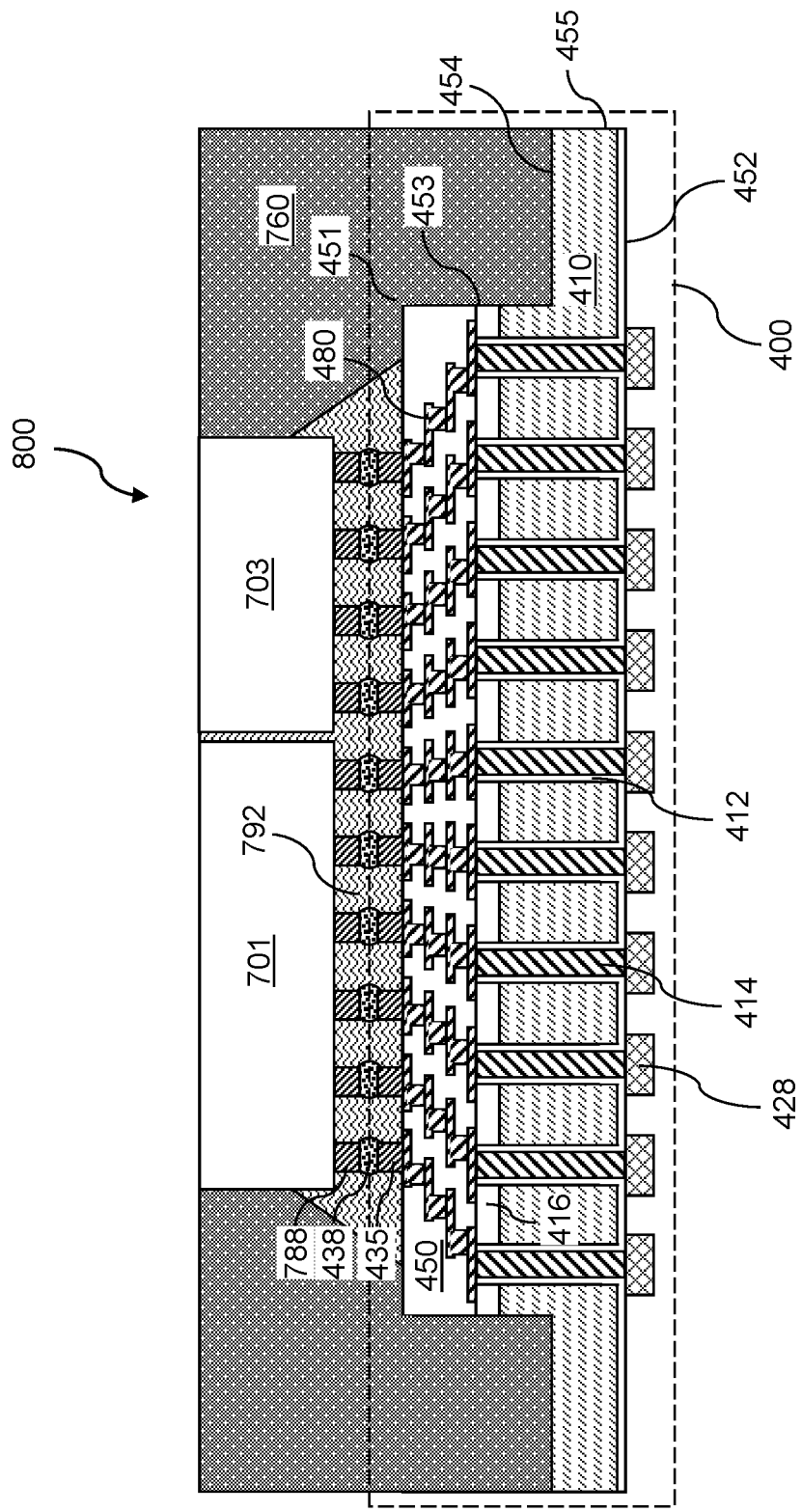
Figure 8E:
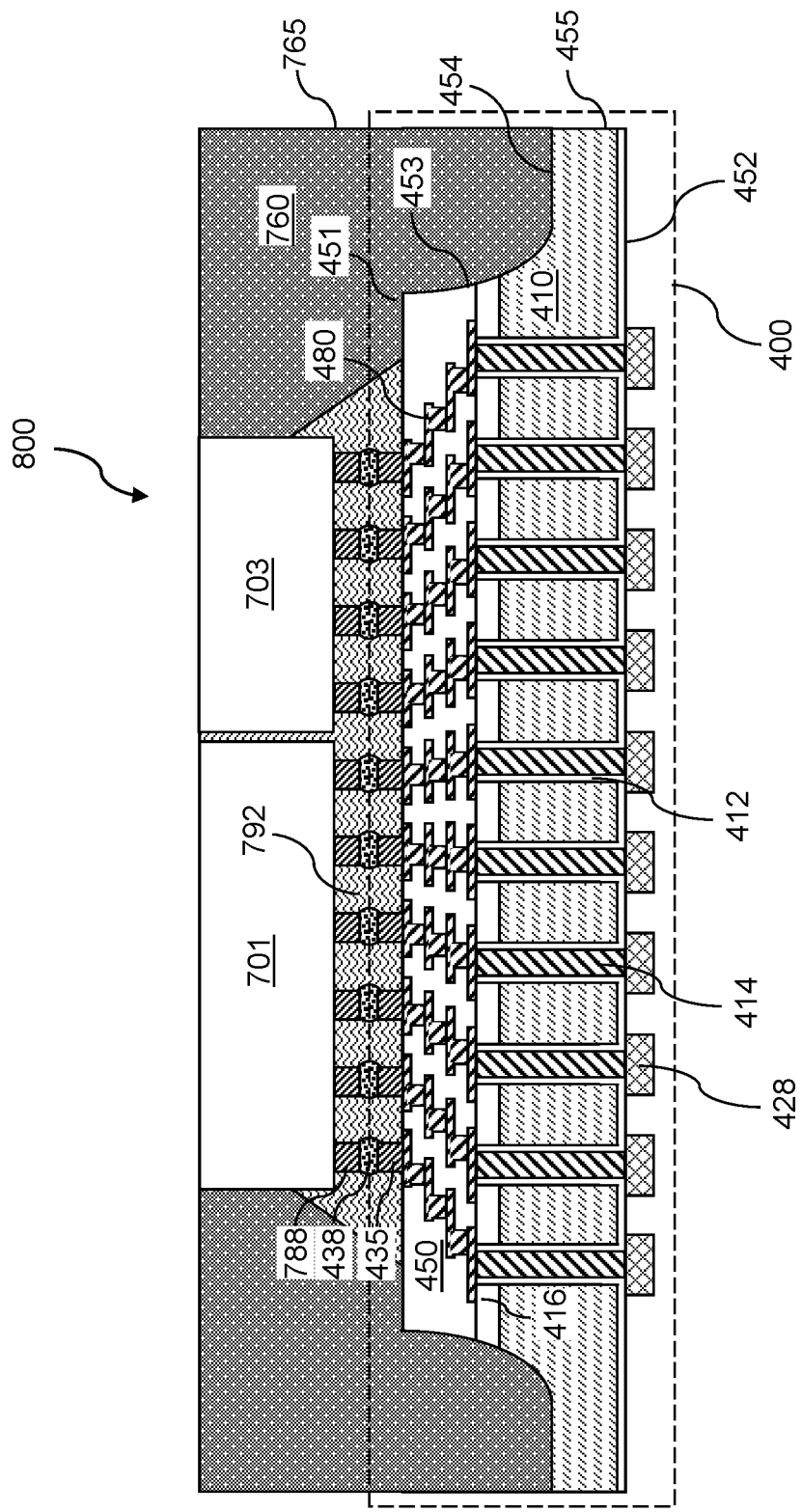

FIGS. 8B-8E are vertical cross-sectional views of alternative embodiments of a fan-out package 800 that may be provided at a processing step corresponding to the processing steps of FIG. 8A according to an embodiment of the present disclosure. FIG. 8B corresponds to the first alternative configuration illustrated in FIG. 5C. FIG. 8C corresponds the second alternative configuration illustrated in FIG. 5D. FIG. 8D corresponds to the third alternative configuration illustrated in FIG. 5E. FIG. 8E corresponds to the fourth alternative configuration illustrated in FIG. 5F.

Referring collectively to FIGS. 8A-8E, a fan-out package 800 is provided, in which a molding compound die frame 760 laterally surrounds, and contacts, a first underfill material portion 792 and at least one semiconductor die (701, 703). In one embodiment, the sidewalls 765 of the molding compound die frame 760 are vertically coincident with the sidewalls 455 of the interposer 400. In one embodiment, the entirety of a set of non-horizontal surfaces 453 and the entirety of the frame-shaped surface 454 are in contact with the molding compound die frame 760 in the fan-out package 800. In one embodiment, the molding compound die frame 760 contacts a peripheral portion of the first planar surface 451.

In one embodiment, the bottom periphery of the set of non-horizontal surfaces 453 is laterally offset inward from the sidewalls 455 of the interposer 400 by a uniform lateral offset distance (such as a frame width) that is less than a minimum lateral distance between the at least one semiconductor die (701, 703) and vertical planes including the sidewalls 455 of the interposer 400.

In one embodiment, the set of non-horizontal surfaces 453 comprise a set of vertical surfaces, a set of concave surfaces, or a set of tapered surfaces having a respective taper angle that is not greater than 45 degrees with respective to a vertical direction. In one embodiment, the frame-shaped surface 454 comprises a planar horizontal surface or a concave surface. In one embodiment, sidewalls 455 of the interposer 400 are vertically coincident with sidewalls 765 of the molding compound die frame 760.

In one embodiment, the set of non-horizontal surfaces 453 is laterally offset outward from an outer periphery of the first underfill material portion 792. In one embodiment, the interposer 400 comprises a semiconductor interposer containing a semiconductor substrate 410 and a plurality of through-substrate via structures 414 vertically extending through the semiconductor substrate 410; and the molding compound die frame 760 contacts surfaces of the semiconductor substrate 410. In one embodiment, the interposer 400 comprises metal interconnect structures 480 located within dielectric material layers 450; and sidewalls of the dielectric material layers 450 are in contact with the molding compound die frame 760, and may comprise segments of the set of non-horizontal surfaces 453 of the interposer 400.

Figure 9:
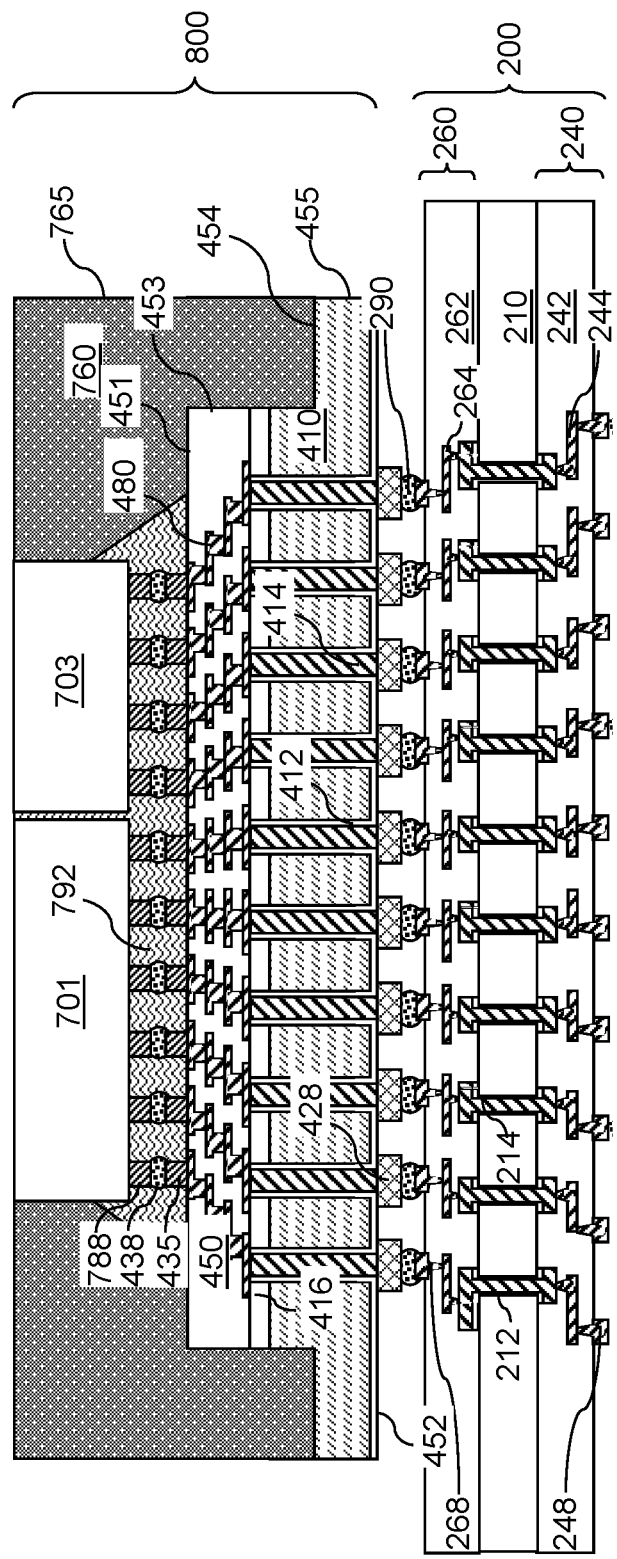
FIG. 9 is a vertical cross-sectional view of an assembly of the fan-out package and a packaging substrate according to an embodiment of the present disclosure.

Referring to FIG. 9, a packaging substrate 200 is provided. The packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layers and/or dielectric interlayers, at least one embedded interposer (such as a silicon interposer). Such a system-integrated packaging substrate may include layer-to-layer interconnections using solder material portions, microbumps, underfill material portions (such as molded underfill material portions), and/or an adhesion film. While the present disclosure is described using an exemplary substrate package, it is understood that the scope of the present disclosure is not limited by any particular type of substrate package and may include an SoIS. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the packaging substrate 200 includes a chip-side surface laminar circuit 260 comprising chip-side wiring interconnects 264 connected to an array of substrate bonding pads 268 that may be bonded to the array of second solder material portions 290, and a board-side surface laminar circuit 240 including board-side wiring interconnects 244 connected to an array of board-side bonding pads 248. The array of board-side bonding pads 248 is configured to allow bonding through solder balls. The array of substrate bonding pads 268 may be configured to allow bonding through C4 solder balls. Generally, any type of packaging substrate 200 may be used. While the present disclosure is described using an embodiment in which the packaging substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

The fan-out package 800 may be disposed over the packaging substrate 200 with an array of the second solder material portions 290 therebetween. In one embodiment, the second solder material portions 290 may be formed on the interposer bonding pads 428 of the fan-out package 800. Alternatively, the second solder material potions 290 may be formed on the substrate bonding pads 268. A reflow process may be performed to reflow the second solder material portions 290, thereby inducing bonding between the fan-out package 800 and the packaging substrate 200. Each second solder material portion 290 may be bonded to a respective one of the interposer bonding pads 428 and to a respective one of the substrate bonding pads 268. In one embodiment, the second solder material portions 290 may include C4 solder balls, and the fan-out package 800 may be attached to the packaging substrate 200 through an array of C4 solder balls. Generally, the fan-out package 800 may be bonded to the packaging substrate 200 such that the interposer 400 is bonded to the packaging substrate 200 by an array of solder material portions (such as the second solder material portions 290).

Figure 10:
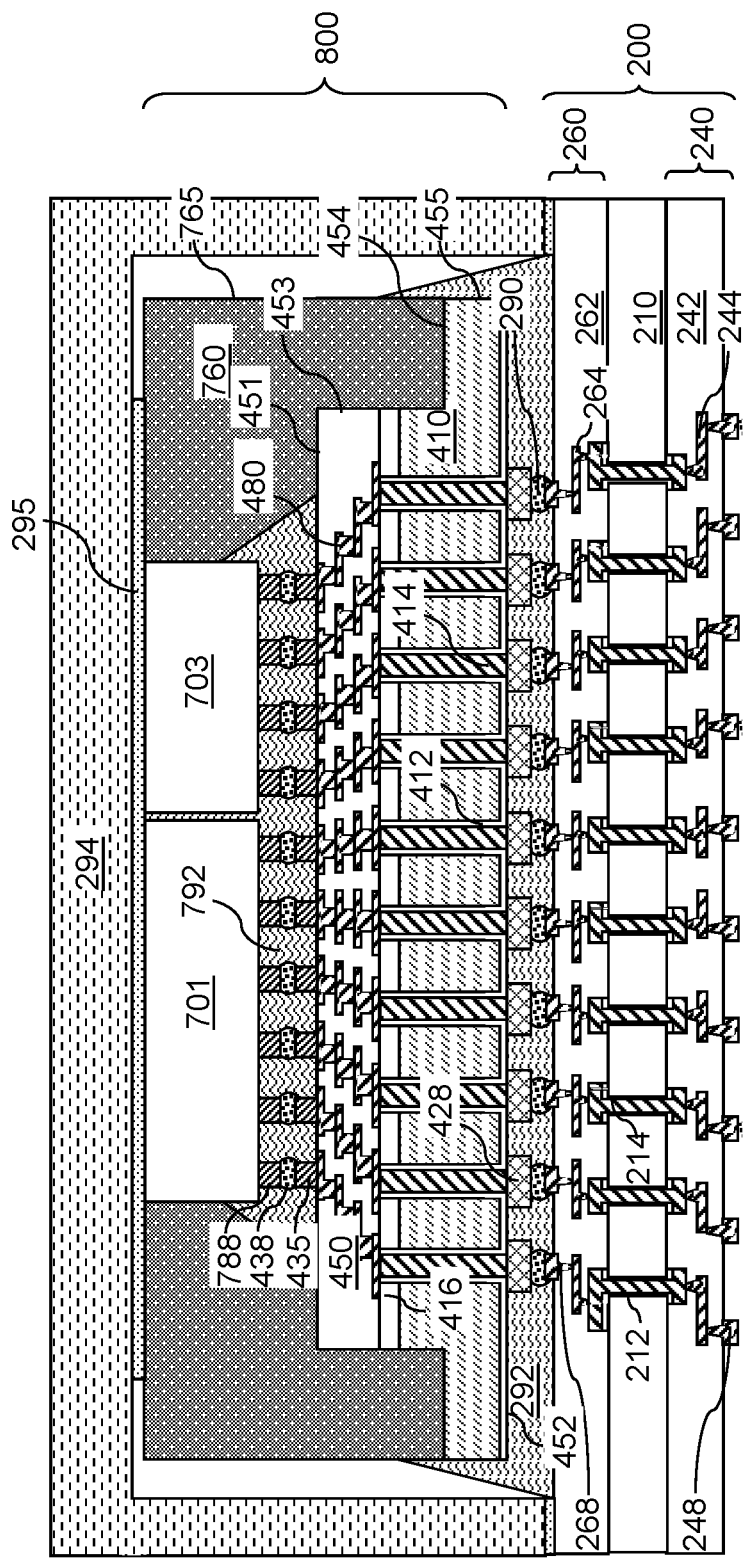
FIG. 10 is a vertical cross-sectional view of the assembly after formation of a second underfill material portion and attaching a stiffener structure according to an embodiment of the present disclosure.

Referring to FIG. 10, an underfill material is applied to the gap between the fan-out package 800 and the packaging substrate 200 to form a second underfill material portion 292. The second underfill material portion 292 may laterally surround, and contact, each of the second solder material portions 290.

A stiffener ring 294 may be attached the packaging substrate 200 using an adhesive layer 293. In one embodiment, the adhesive layer 293 may be applied to a peripheral region of a top surface of the packaging substrate 200. In one embodiment, the thermal interface material (TIM) layer 295 may be applied to the physically exposed top surfaces of the at least one semiconductor die (701, 703) and the molding compound die frame 760 such that the TIM layer 295 contacts a bottom surface of the stiffener ring 294.

Figure 11:
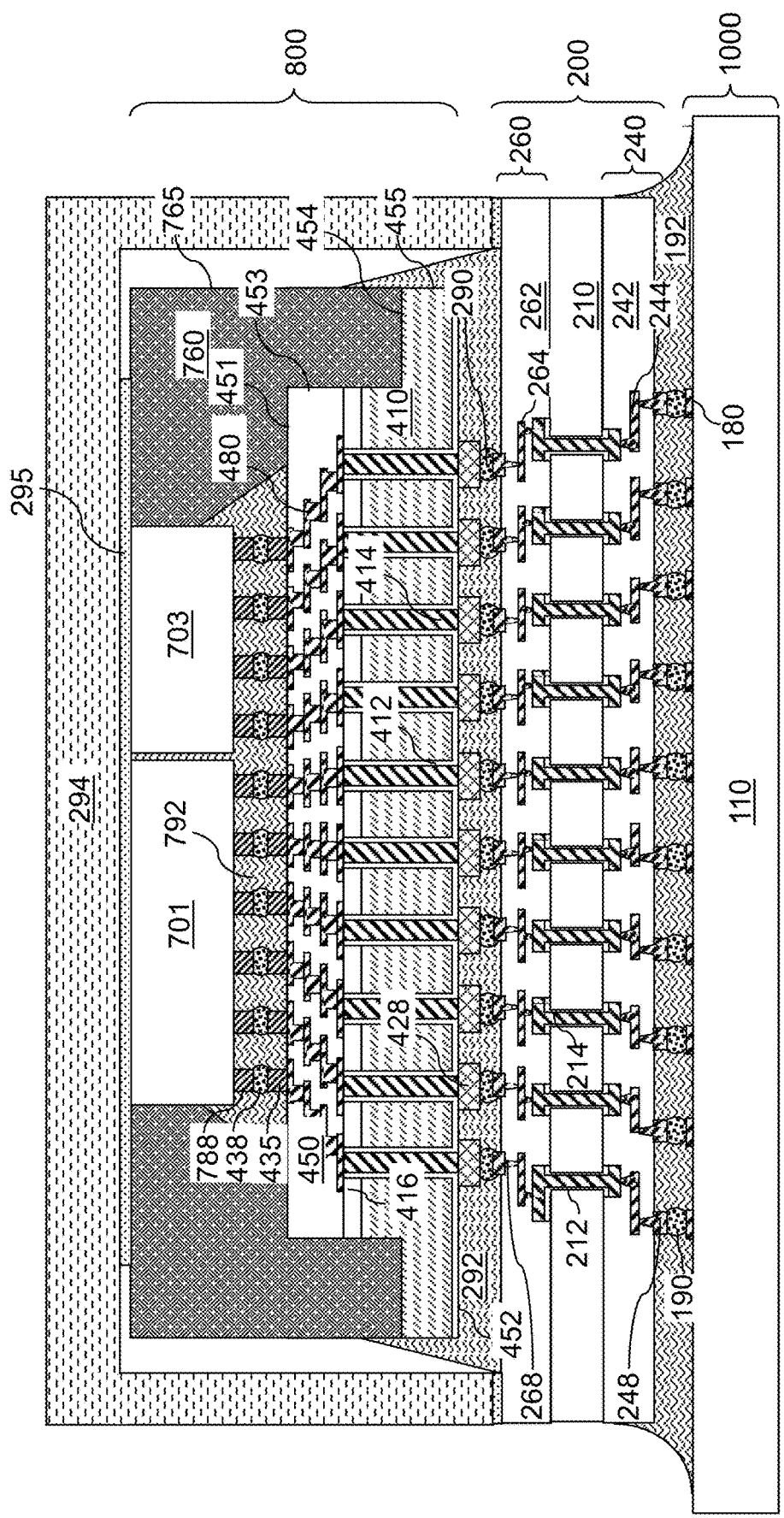
FIG. 11 is a vertical cross-sectional view of the structure after the packaging substrate is attached to a printed circuit board (PCB) according to an embodiment of the present disclosure.

Referring to FIG. 11, a printed circuit board (PCB) 1000 including a PCB substrate 110 and PCB bonding pads 180 may be provided. The PCB 1000 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An additional underfill material portion, which is herein referred to as a board-substrate underfill material portion 192 or a BS underfill material portion 192, may be formed around the solder joints 190 by applying and shaping an underfill material. The packaging substrate 200 is attached to the PCB 1000 through the array of solder joints 190.

Generally, a printed circuit board 1000 may be bonded to the packaging substrate 200 through an array of solder joints 190. An additional underfill material portion (such as the board-substrate underfill material portion 192) may be formed between the printed circuit board 1000 and the packaging substrate 200, and may laterally surround the solder joints 190.

Generally, a printed circuit board 100 may be bonded to the packaging substrate 200 through an array of solder joints 190. An additional underfill material portion (such as the board-substrate underfill material portion 192) may be formed between the printed circuit board 100 and the packaging substrate 200, and may laterally surround the solder joints 190.

Figure 12:
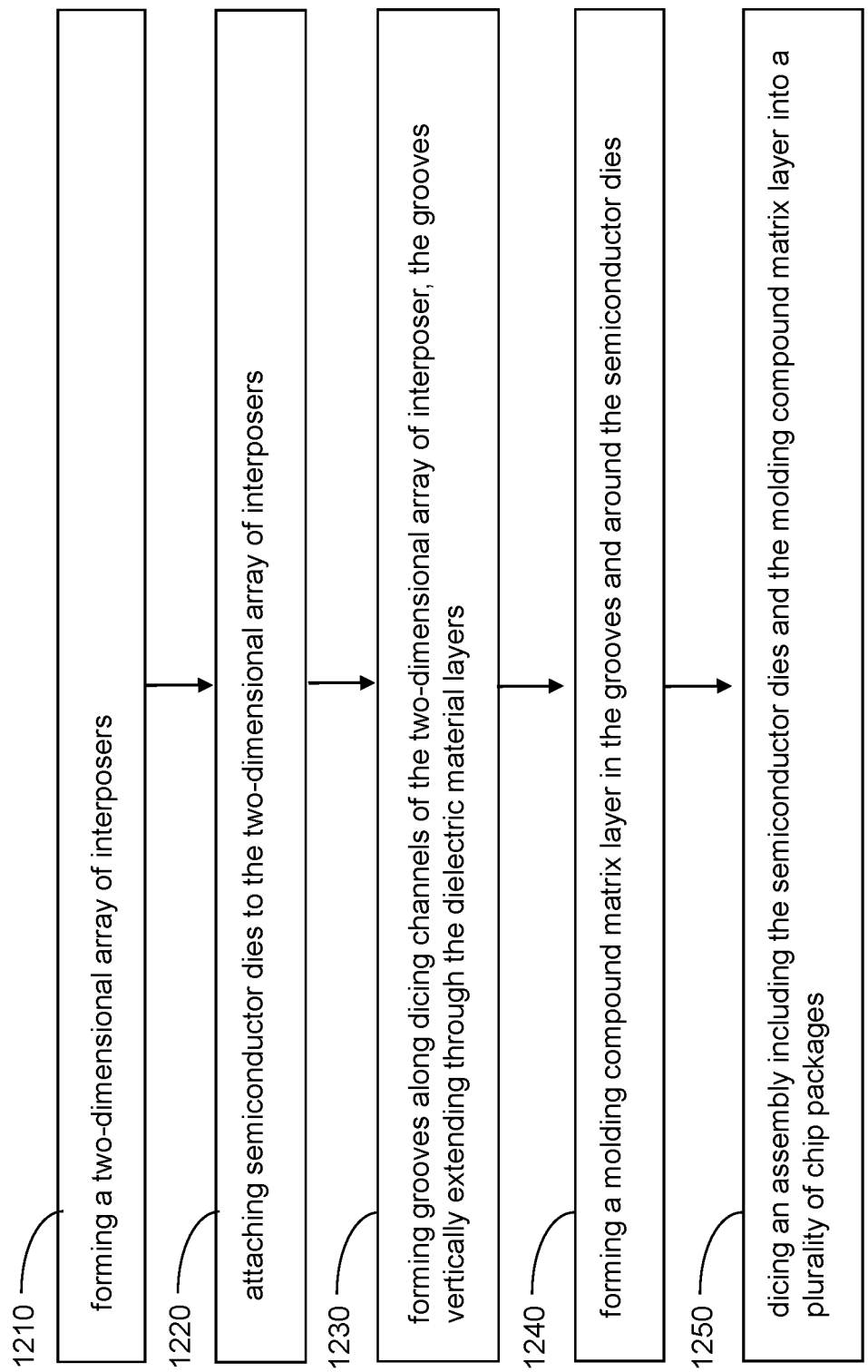
FIG. 12 is a flowchart illustrating steps for forming chip packages according to an embodiment of the present disclosure.

Referring to FIG. 12, a flowchart illustrates steps for forming chip packages according to an embodiment of the present disclosure.

Referring to step 1210 and FIGS. 1-3D, a two-dimensional array of interposers 400 may be formed, for example, on a carrier wafer 310. Each of the interposers 400 comprises a respective set of through-substrate via structures 414 and a respective set of metal interconnect structures 480 formed within dielectric material layers 450.

Referring to step 1220 and FIGS. 4A and 4B, semiconductor dies (701, 703) may be attached to the two-dimensional array of interposers 400.

Referring to step 1230 and FIGS. 5A-5F, grooves 459 may be formed along dicing channels of the two-dimensional array of interposers 400. The grooves 459 vertically extend through the dielectric material layers 450.

Referring to step 1240 and FIGS. 6 and 7, a molding compound matrix 760M may be formed in the grooves 459 and around the semiconductor dies (701, 703).

Referring to step 1250 and FIGS. 8A-11, an assembly including the semiconductor dies (701, 703) and the molding compound matrix 760M may be diced into a plurality of chip packages such as a plurality of fan-out packages 800.

Referring to all drawings and according to various embodiments of the present disclosure, a semiconductor structure is provided, which comprises: an interposer 400 including a first planar surface 451, a set of non-horizontal surfaces 453 having a top periphery that are adjoined to a periphery of the first planar surface 451, and a frame-shaped surface 454 adjoined to a bottom periphery of the set of non-horizontal surfaces 453, sidewalls 455 adjoined to the frame-shaped surface 454, and a second planar surface 452 adjoined to the sidewalls 455; at least one semiconductor die (701, 703) attached to the interposer 400 through a respective array of solder material portions 438; and an underfill material portion 792 located between the interposer 400 and the at least one semiconductor die (701, 703) and contacting a portion of the first planar surface 451.

In one embodiment, an outer periphery of the underfill material portion 792 is laterally offset inward from the set of non-horizontal surfaces 453. In one embodiment, the semiconductor structure comprises a molding compound die frame 760 laterally surrounding the underfill material portion 792 and the at least one semiconductor die (701, 703). In one embodiment, sidewalls 765 of the molding compound die frame 760 are vertically coincident with the sidewalls 455 of the interposer 400. In one embodiment, an entirety of the set of non-horizontal surfaces 453 and an entirety of the frame-shaped surface 454 are in contact with the molding compound die frame 760. In one embodiment, the molding compound die frame 760 contacts a peripheral portion of the first planar surface 451.

In one embodiment, the bottom periphery of the set of non-horizontal surfaces 453 is laterally offset inward from the sidewalls 455 of the interposer 400 by a uniform lateral offset distance that is less than a minimum lateral distance between the at least one semiconductor die (701, 703) and vertical planes including the sidewalls 455 of the interposer 400. In one embodiment, the set of non-horizontal surfaces 453 comprise a set of vertical surfaces, a set of concave surfaces, or a set of tapered surfaces having a respective taper angle that is not greater than 45 degrees with respective to a vertical direction. In one embodiment, the frame-shaped surface 454 comprises a planar horizontal surface or a concave surface.

In one embodiment, the interposer 400 comprises a semiconductor interposer containing a semiconductor substrate 410, a plurality of through-substrate via structures 414 vertically extending through the semiconductor substrate 410, and metal interconnect structures 480 located within dielectric material layers 450 and over the semiconductor substrate 410.

According to another aspect of the present disclosure, a semiconductor structure comprising a fan-out package 800 is provided. The fan-out package 800 comprises: an interposer 400 including a first planar surface 451, a set of non-horizontal surfaces 453 having a top periphery that are adjoined to a periphery of the first planar surface 451, and a frame-shaped surface 454 adjoined to a bottom periphery of the set of non-horizontal surfaces 453; at least one semiconductor die (701, 703) that is attached to the interposer 400 through a respective array of solder material portions 438; an underfill material portion 792 located between the interposer 400 and the at least one semiconductor die (701, 703) and contacting a portion of the first planar surface 451; and a molding compound die frame 760 that laterally surrounds the at least one semiconductor die (701, 703) and the underfill material portion 792 and contacting the frame-shaped surface 454.

In one embodiment, sidewalls 455 of the interposer 400 are vertically coincident with sidewalls 765 of the molding compound die frame 760. In one embodiment, the set of non-horizontal surfaces 453 is laterally offset outward from an outer periphery of the underfill material portion 792.

In one embodiment, the interposer 400 comprises a semiconductor interposer 400 containing a semiconductor substrate 410 and a plurality of through-substrate via structures 414 vertically extending through the semiconductor substrate 410; and the molding compound die frame 760 contacts surfaces of the semiconductor substrate 410.

In one embodiment, the interposer 400 comprises metal interconnect structures 480 located within dielectric material layers 450; and sidewalls 455 of the dielectric material layers 450 are in contact with the molding compound die frame 760.

The various embodiments of the present disclosure provides configurations that suppresses and/or eliminates delamination and/or cracking of an underfill material portion 792 between an interposer 400 and at least one semiconductor die (701, 703) by providing a stepped surface including a frame-shaped surface 454 and at set of non-horizontal surfaces 453 on the interposer 400 such that a molding compound die frame 760 contacts the stepped surface. The direct contact between the stepped surface of the interposer 400 and the molding compound die frame 760 may reduce the thermal stress on the underfill material portion 792, and increases the reliability of the chip package without increasing the warpage of the chip package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
    an interposer including a vertical stack of a semiconductor substrate embedding through-substrate via structures and dielectric material layers embedding metal interconnect structures, wherein the interposer comprises a first planar surface, a set of non-horizontal surfaces comprising concave surfaces or tapered surfaces and having a top periphery that is adjoined to a periphery of the first planar surface, a frame-shaped surface which has an outer periphery and an inner periphery that is laterally offset inward relative to the outer periphery and is adjoined to a bottom periphery of the set of non-horizontal surfaces, interposer sidewalls adjoined to the frame-shaped surface, and a second planar surface adjoined to the interposer sidewalls, wherein the set of non-horizontal surfaces comprises sidewalls of the dielectric material layers and upper sidewalls of the semiconductor substrate which are laterally offset inward relative to lower sidewalls of the semiconductor substrate by the frame-shaped surface and have a top periphery that coincides with a bottom periphery of the sidewalls of the dielectric material layers;
    at least one semiconductor die attached to the interposer through a respective array of solder material portions; and
    an underfill material portion located between the interposer and the at least one semiconductor die and contacting a portion of the first planar surface.

2. The semiconductor structure of claim 1, wherein an outer periphery of the underfill material portion is laterally offset inward from the set of non-horizontal surfaces.

3. The semiconductor structure of claim 1, further comprising a molding compound die frame laterally surrounding the underfill material portion and the at least one semiconductor die.

4. The semiconductor structure of claim 3, wherein the molding compound die frame comprises:
inner sidewalls in contact with an entirety of the set of non-horizontal surfaces; and
a frame-shaped bottom surface that contacts an entirety of the frame-shaped surface of the interposer at a horizontal plane that is more distal from the at least one semiconductor die than the first planar surface is from the at least one semiconductor die.

5. The semiconductor structure of claim 4, wherein a peripheral region of the first planar surface is in contact with the molding compound die frame.

6. The semiconductor structure of claim 3, wherein outer sidewalls of the molding compound die frame are vertically coincident with the interposer sidewalls.

7. The semiconductor structure of claim 3, wherein an entirety of the set of non-horizontal surfaces and an entirety of the frame-shaped surface are in contact with the molding compound die frame.

8. The semiconductor structure of claim 3, wherein the molding compound die frame contacts a peripheral portion of the first planar surface.

9. The semiconductor structure of claim 1, wherein the bottom periphery of the set of non-horizontal surfaces is laterally offset inward from the sidewalls of the interposer by a uniform lateral offset distance that is less than a minimum lateral distance between the at least one semiconductor die and vertical planes including the sidewalls of the interposer.

10. The semiconductor structure of claim 1, wherein the set of non-horizontal surfaces comprise a set of vertical surfaces, a set of concave surfaces, or a set of tapered surfaces having a respective taper angle that is not greater than 45 degrees with respective to a vertical direction.

11. The semiconductor structure of claim 1, wherein the frame-shaped surface comprises a planar horizontal surface or a concave surface.

12. A semiconductor structure comprising a fan-out package, wherein the fan-out package comprises:
an interposer including a vertical stack of a semiconductor substrate embedding through-substrate via structures and dielectric material layers embedding metal interconnect structures, wherein the interposer comprises a first planar surface, a set of non-horizontal surfaces comprising concave surfaces or tapered surfaces and having a top periphery that is adjoined to a periphery of the first planar surface, a frame-shaped surface which has an outer periphery and an inner periphery that is laterally offset inward relative to the outer periphery and is adjoined to a bottom periphery of the set of non-horizontal surfaces, interposer sidewalls adjoined to the frame-shaped surface, and a second planar surface adjoined to the interposer sidewalls, wherein the set of non-horizontal surfaces comprises sidewalls of the dielectric material layers and upper sidewalls of the semiconductor substrate which are laterally offset inward relative to lower sidewalls of the semiconductor substrate by the frame-shaped surface and have a top periphery that coincides with a bottom periphery of the sidewalls of the dielectric material layers;
at least one semiconductor die that is attached to the interposer through a respective array of solder material portions;
an underfill material portion located between the interposer and the at least one semiconductor die and contacting a portion of the first planar surface; and
a molding compound die frame that laterally surrounds the at least one semiconductor die and the underfill material portion and contacting the frame-shaped surface.

13. The semiconductor structure of claim 12, wherein interposer sidewalls are vertically coincident with outer sidewalls of the molding compound die frame.

14. The semiconductor structure of claim 12, wherein the set of non-horizontal surfaces is laterally offset outward from an outer periphery of the underfill material portion.

15. The semiconductor structure of claim 12, wherein the molding compound die frame comprises:
inner sidewalls in contact with an entirety of the set of non-horizontal surfaces; and
a frame-shaped bottom surface that contacts an entirety of the frame-shaped surface of the interposer at a horizontal plane that is more distal from the at least one semiconductor die than the first planar surface is from the at least one semiconductor die.

16. A semiconductor structure comprising:
an interposer including a vertical stack of a semiconductor substrate embedding through-substrate via structures and dielectric material layers embedding metal interconnect structures, wherein the interposer comprises a first planar surface, a set of non-horizontal surfaces comprising concave surfaces or tapered surfaces and having a top periphery that is adjoined to a periphery of the first planar surface, a frame-shaped surface which has an outer periphery and an inner periphery that is laterally offset inward relative to the outer periphery and is adjoined to a bottom periphery of the set of non-horizontal surfaces, interposer sidewalls adjoined to the frame-shaped surface, and a second planar surface adjoined to the interposer sidewalls, wherein the set of non-horizontal surfaces comprises sidewalls of the dielectric material layers and upper sidewalls of the semiconductor substrate which are laterally offset inward relative to lower sidewalls of the semiconductor substrate by the frame-shaped surface and have a top periphery that coincides with a bottom periphery of the sidewalls of the dielectric material layers;
at least one semiconductor die attached to the interposer through a respective array of solder material portions; and
a molding compound die frame laterally surrounding the at least one semiconductor die.

17. The semiconductor structure of claim 16, wherein the molding compound die frame is in contact with each surface within the set of non-horizontal surfaces.

18. The semiconductor structure of claim 16, wherein the molding compound die frame is in contact with an entirety of the frame-shaped surface.

19. The semiconductor structure of claim 16, wherein the interposer sidewalls are vertically coincident with sidewalls of the molding compound die frame.

20. The semiconductor structure of claim 16, wherein the molding compound die frame comprises:
inner sidewalls in contact with an entirety of the set of non-horizontal surfaces; and
a frame-shaped bottom surface that contacts an entirety of the frame-shaped surface of the interposer at a horizontal plane that is more distal from the at least one semiconductor die than the first planar surface is from the at least one semiconductor die.

* * * * *